(12) United States Patent
Tanaka

(10) Patent No.: US 7,630,064 B2
(45) Date of Patent: Dec. 8, 2009

(54) PREDICTION METHOD AND APPARATUS FOR SUBSTRATE PROCESSING APPARATUS

(75) Inventor: Hideki Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 11/684,298

(22) Filed: Mar. 9, 2007

(65) Prior Publication Data

US 2007/0215574 A1 Sep. 20, 2007

Related U.S. Application Data

(60) Provisional application No. 60/785,998, filed on Mar. 27, 2006.

(30) Foreign Application Priority Data

Mar. 16, 2006 (JP) ............................. 2006-073375

(51) Int. Cl.
*G01N 21/00* (2006.01)
(52) U.S. Cl. .......................................... 356/72; 438/17
(58) Field of Classification Search ........................ None
See application file for complete search history.

(56) References Cited

U.S. PATENT DOCUMENTS 6,985,215 B2 * 1/2006 Oh et al. ........................ 356/72
7,263,463 B2 8/2007 Yamazaki
2005/0071037 A1 * 3/2005 Strang ......................... 700/121
2005/0146709 A1 * 7/2005 Oh et al. ........................ 356/72

FOREIGN PATENT DOCUMENTS

JP 2003-23001 1/2003

* cited by examiner

*Primary Examiner*—Charles D. Garber
*Assistant Examiner*—Andre' C Stevenson
(74) *Attorney, Agent, or Firm*—Oblon, Spivak, McClelland, Maier & Neustadt, L.L.P.

(57) ABSTRACT

A prediction method for a substrate processing apparatus is to predict processing results from operation data on the substrate processing apparatus during a procedure for processing a target processing substrate in a processing chamber of the substrate processing apparatus. The method includes the steps of: collecting operation data obtained; and obtaining a moving average of a preset number of sets of data using the processing result data collected at the data collection step. The method further includes the steps of: performing multivariate analysis using the operation data collected at the data collection step and the moving average processing result data obtained at the moving average processing step; and predicting processing results using operation data obtained when a target processing substrate, other than the target processing substrate used to obtain the correlation at the analysis step, is processed on a basis of the correlation.

23 Claims, 12 Drawing Sheets

PREDICTION METHOD AND APPARATUS FOR SUBSTRATE PROCESSING APPARATUS

FIELD OF THE INVENTION

The present invention relates to a prediction method and apparatus for a substrate processing apparatus.

BACKGROUND OF THE INVENTION

For semiconductor manufacturing processes, various substrate processing apparatuses have been used. For example, in a sputtering process or an etching process for a target processing substrate, such as a semiconductor wafer (hereinafter, referred to as "wafer") or a glass substrate, a substrate processing apparatus, such as a plasma processing apparatus, has been generally used. In a plasma processing apparatus, process gas introduced into an airtight processing chamber is converted into plasma, and thus the surface of the wafer is plasma processed. If such plasma processing is repeated, a reaction product generated by plasma is attached to the inner wall of the processing chamber, or the parts, such as electrodes arranged in the processing chamber, are worn out, so that the status of the apparatus is slightly changed. Since the status of plasma is also changed according to the status of the apparatus, there is a possibility that the status of the apparatus may influence the processing results, such as the etched shape of a wafer. Therefore, in order to consistently execute stable processing, processing results, including processing characteristics, such as data on the shape of a plasma-processed wafer, and apparatus status, such as the degree of consumption of parts in a processing chamber, should be monitored.

Due thereto, a test wafer, for example, is manufactured in advance, and etching processing is periodically performed on the test wafer, so that the processing characteristics or the status of a substrate processing apparatus may be determined for each etching processing operation on the basis of data on the processing results thereof (for example, the degree of consumption of the test wafer, etc.). According to this example, processing characteristics, or the status of the substrate processing apparatus, can be relatively precisely determined, but there are problems in that, since a large number of test wafers is manufactured, and is processed using a substrate processing apparatus, and respective processing result data must be measured for respective test wafers, a large number of manufacturing processes and a lot of time are required to manufacture test wafers and measure processing results.

In this case, a method of performing plasma processing using a wafer for model creation before a wafer to be manufactured as a product (hereinafter referred to as "wafer for product") is processed, of creating a modeling equation required to correlate electronic data, which indicates plasma status, with processing result data, such as plasma processing characteristics, of applying electronic data, obtained when the wafer for a product is processed, to the modeling equation, and of predicting plasma processing characteristics, has been proposed (for examples, see Patent References 1 and 2). According to such a prediction method, although the wafer for a product cannot actually be measured, the processing results thereof can be predicted, so that the processing characteristics of the wafer for a product or the status of a substrate processing apparatus can be recognized without requiring a large number of manufacturing processes or consuming a lot of time.

[Patent Reference 1] Japanese Patent Laid-Open publication No. 2003-023001

[Patent Reference 2] Japanese Patent Laid-Open Publication No. 2004-335841

However, since such a conventional prediction method creates a modeling equation using processing result data obtained by measuring a wafer for model creation using a measurement instrument after plasma processing has been performed, there is highly likely that an error is included in the processing result data used for model creation. If a modeling equation is created using the processing result data including the error, the error may also influence prediction results made using the modeling equation, thereby reducing accuracy of prediction.

SUMMARY OF THE INVENTION

It is, therefore, an object of the present invention to provide a prediction method and apparatus for a substrate processing apparatus, which can obtain a correlation (a regression equation and a model) between operation data and processing result data so that the influence caused by an error included in the processing result data on the correlation is minimized, thus improving the prediction accuracy of processing results when processing a target processing substrate.

To achieve the object, in accordance with one aspect of the present invention, there is provided a prediction method for a substrate processing apparatus, the prediction method predicting processing results from operation data on the substrate processing apparatus during a procedure for processing a target processing substrate in a processing chamber of the substrate processing apparatus, comprising a data collection step of collecting operation data obtained whenever the target processing substrate is processed, and processing result data obtained by measuring status of the target processing substrate, a moving average processing step of obtaining a moving average of a preset number of pieces of data using the processing result data collected at the data collection step, thus obtaining moving average processing result data, an analysis step of performing multivariate analysis using the operation data collected at the data collection step and the moving average processing result data obtained at the moving average processing step, thus obtaining a correlation between the operation data and the moving average processing result data, and a prediction step of predicting processing results using operation data obtained when a target processing substrate, other than the target processing substrate used to obtain the correlation at the analysis step, is processed on a basis of the correlation.

To achieve the object, in accordance with another aspect of the present invention, there is provided a prediction apparatus for a substrate processing apparatus, the prediction apparatus predicting processing results from operation data on the substrate processing apparatus during a procedure for processing a target processing substrate in a processing chamber of the substrate processing apparatus, comprising data collection unit for collecting operation data obtained whenever the target processing substrate is processed, and processing result data obtained by measuring status of the target processing substrate, moving average processing unit for obtaining a moving average of a preset number of pieces of data using the processing result data collected by the data collection unit, thus obtaining moving average processing result data, analysis unit for performing multivariate analysis using the operation data collected by the data collection unit and the moving average processing result data obtained by the moving average processing unit, thus obtaining a correlation between the operation data and the moving average processing result data, and prediction unit for predicting processing results using operation data obtained when a target processing substrate, other than the target processing substrate used to obtain the correlation by the analysis unit, is processed on a basis of the correlation.

According to the apparatus and method of the present invention, moving average processing is performed on processing result data having a high probability of including an error, among data required to obtain a correlation (model), a correlation between the processing result data, obtained through moving average processing, and operation data is obtained, and the status is predicted on the basis of the correlation. Accordingly, even if an error is included in the processing result data itself, the influence of the error is not applied to the correlation. As a result, the prediction accuracy of the results of processing target processing substrates other than the target processing substrate that was used to obtain the above correlation can be improved. Further, as for data collection, operation data and processing result data may be collected whenever each target processing substrate is processed. Alternatively, after operation data has been collected when each of a plurality of target processing substrates is processed, the status of the target processing substrates, obtained after processing, is arranged and measured, and thus the processing result data can be collected.

Preferably, the moving average processing may be performed such that, when processing result data, obtained before and after the maintenance of the substrate processing apparatus, is included in the processing result data, the processing result data is divided into groups for respective sections defined by the maintenance, and such that, for each group, moving averages of a predetermined number of pieces of data are obtained using the processing result data belonging to the group, thus obtaining moving average processing result data. Accordingly, even if the status of the processing chamber is changed by the performance of maintenance, the influence of the status change is not applied to the moving average processing result data, thus further improving the prediction accuracy in the processing results of the target processing substrate.

Preferably, the moving average processing may be performed such that, for each group, moving average processing result data corresponding to considered processing result data is calculated while the considered processing result data is shifted by one piece. In this case, the moving average processing may be performed such that until a number of pieces of data preceding the considered processing result data reaches the preset number of pieces of data, an average value is obtained using all pieces of processing result data preceding the considered processing result data, and the average value is taken as moving average processing result data corresponding to the considered processing result data, and when the number of pieces of data preceding the considered processing result data reaches the preset number of pieces of data or more, an average value is obtained using only processing result data that immediately precedes the considered processing result data and corresponds to the preset number of pieces of data, and the obtained average value is taken as moving average processing result data corresponding to the considered processing result data. In this way, the number of pieces of processing result data used to calculate moving averages is adjusted for each piece of considered processing result data, thus obtaining moving average processing result data using the number of pieces of processing result data that is closest to the preset number of pieces of data, without using processing result data belonging to other groups. As a result, moving average processing result data having a minimum error can be obtained, thus improving the precision of prediction of the processing results of the target processing substrate.

Preferably, the number of pieces of data required to obtain each moving average may be preset in advance for each group. Moreover, the number of pieces of data required to obtain each moving average may be preferably set to one falling within a range between 2 and 10, according to the number of pieces of processing result data belonging to each group. According to this embodiment, since optimal moving average processing according to the number of pieces of processing result data, used to calculate respective moving average processing result data, can be performed, a more reliable model (a correlation equation between operation data and processing result data) can be created. Further, if processing results of the target processing substrate can be predicted using this model, the quality of the target processing substrate can be precisely determined using the predicted value.

Further, the prediction method may be operated such that a management value range is set to have a certain width based on a target value of processing results so as to manage the processing results, an upper prediction error range is set to have a certain width based on an upper limit of the management value range, and a lower prediction error range is set to have a certain width based on a lower limit of the management value range, if a predicted value for status of the target processing substrate obtained at the prediction step is within an allowable prediction range when a range from a lower limit of the upper prediction error range to an upper limit of the lower prediction error range is set to the allowable prediction range, status of the target processing substrate is determined to be normal, if the predicted value is included in the upper prediction error range or the lower prediction error range even though the predicted value departs from the allowable prediction range, the status of the target processing substrate is determined based on a measured value obtained by measuring the target processing substrate, and if the predicted value departs from the allowable prediction range, and also departs from the upper prediction error range and the lower prediction error range, the status of the target processing substrate is determined to be abnormal. Preferably, each of the prediction error ranges may be set according to a standard error between the predicted value and a measured value.

In this way, respective ranges are set to manage processing results, so that the quality of the results of processing a target processing substrate can be determined in consideration of a prediction error. Further, if a predicted value is included in the upper prediction error range or the lower prediction error range even though the predicted value departs from the allowable prediction range, the status of the target processing substrate is not determined any longer on the basis of the predicted value. As described above, the quality of the results of processing the target processing substrate can be determined with high precision, without requiring a large number of manufacturing processes and a lot of time.

Further, since the processing dimensions of the target processing substrate may be used as the predicted value, the processing dimensions of the target processing substrate can be used as processing result data. Further, electronic data obtained from a plurality of detectors provided in the substrate processing apparatus can be used as operation data. Further, if Partial Least Squares (PLS) is used as multivariate analysis, a correlation equation having high stability and reliability can be obtained.

As described above, the present invention can obtain a correlation (a regression equation and a model) between operation data and processing result data so that an error does not influence the correlation even though the error is included in the processing result data itself, thus improving prediction accuracy when a target processing substrate is processed.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Figure 1:
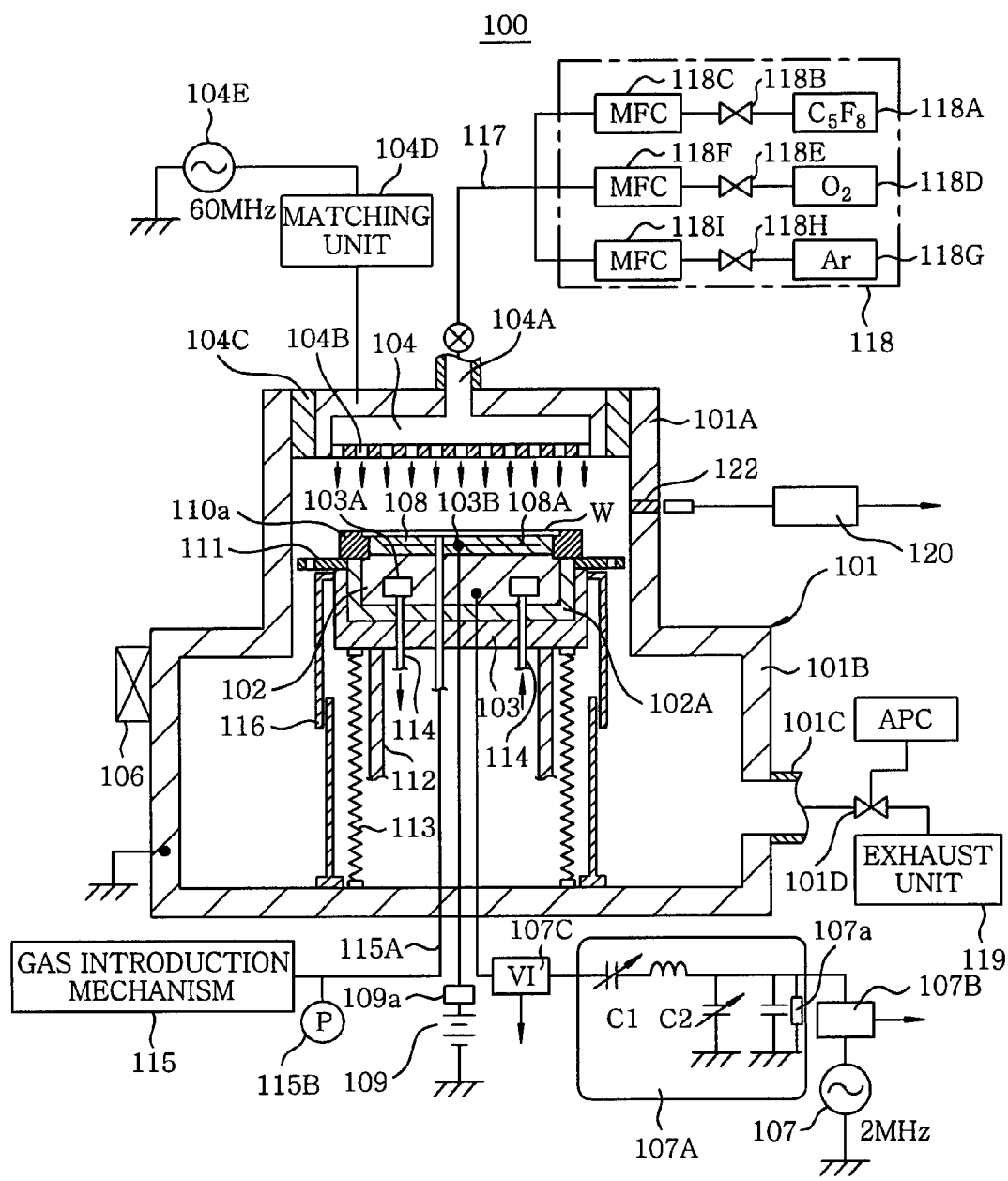
FIG. 1 is a sectional view of a plasma processing apparatus according to an embodiment of the present invention.

Hereinafter, embodiments of the present invention will be described in detail with reference to the attached drawings. Reference now should be made to the drawings, in which the same reference numerals are used throughout the different drawings to designate the same or similar components, and thus a detailed description thereof is omitted.

(Plasma Processing Apparatus)

First, a parallel plate plasma etching apparatus (hereinafter, referred to as "plasma processing apparatus 100"), employed as a plasma processing apparatus according to an embodiment of the present invention, is described. In an example shown in FIG. 1, the plasma processing apparatus 100 includes a processing chamber 101 made of an aluminum material, a vertically movable support 103 made also of an aluminum material and adapted to support a lower electrode 102 arranged in the processing chamber 101 through an insulating material 102A, and a shower head 104 arranged over the support 103 and adapted to supply processing gas. The shower head 104 also functions as an upper electrode, and is isolated from the processing chamber 101 by an insulating material 104C. Hereinafter, the shower head 104 will be also designated as an upper electrode 104.

A first high frequency power source 104E is connected to the upper electrode 104, and a matching unit 104D is disposed in the feeder line thereof. The high frequency power source 104E provides power ranging from about 50 to 150 MHz. The high frequency power is applied to the upper electrode 104 in this way, so that high density plasma can be formed within the processing chamber 101 in a preferable dissociated state, and thus plasma processing is possible under a low voltage condition. Preferably, the output frequency of the first high frequency power source 104E ranges from about 50 to 80 MHz. Typically, a frequency of 60 MHz, as shown in the drawing, or a frequency close thereto is employed as the output frequency.

A detection window 122 is provided at the sidewall of the processing chamber 101, and on the outer side of the sidewall of the processing chamber 101, an optical measuring instrument 120, such as a spectroscope for detecting occurring of plasma emission in the processing chamber 101, is installed through the detection window 122.

The processing chamber 101 includes an upper chamber 101A having a small diameter located in an upper portion, and a lower chamber 101B having a large diameter 101B located in a lower portion. A gate for transferring a wafer W in and out of the processing chamber 101 is formed on the upper portion of the lower chamber 101B, and a gate valve 106 is attached to the gate.

A second high frequency power source 107 is connected to the lower electrode 102 through an electrical measuring instrument (e.g., a VI probe) 107C, a matching unit 107A, and a wattmeter 108B. The second high frequency power source 107 provides power ranging from several hundreds of kHz to several tens of MHz. Such a frequency within this range is applied to the lower electrode 102, so that a suitable ionizing action can be performed on a wafer W, which is a target processing substrate, without damaging the wafer W. Typically, a frequency of 2 MHz, as shown in the drawing, is employed as the frequency of the second high frequency power source 107. Further, in the embodiment of the present invention, high frequency power of 2 MHz is output from the second high frequency power source 107, but high frequency power having a frequency corresponding to integer multiples of 2 MHz, based on 2 MHz as a fundamental wave frequency (for example, 4 MHz, 8 MHz, 10 MHz, etc.), may also be applied to the lower electrode 102 in addition to the high frequency power having a frequency of 2 MHz.

More particularly, the matching unit 107A includes, for example, two variable condensers C1 and C2, a condenser C, and a coil L, and realizes impedance matching through the variable condensers C1 and C2. Further, in the matching unit 107A, a detector (not shown) for measuring radio frequency (RF) voltage Vpp at the lower electrode side 102 (RF voltage output side) is provided.

The matching unit 107A is provided with a voltmeter 107a, by which the voltage Vdc between a supply line (electric wire) for the second high frequency power and the ground of the plasma processing apparatus 100 is measured.

The lower electrode side 102 of the matching unit 107A (high frequency power output source) is connected to a wattmeter 107B, by which second high frequency power P from the second high frequency power source 107 is measured.

In a fundamental wave based on plasma generated in the upper chamber 101A (for example, the traveling wave and the reflected wave of high frequency power), and harmonic waves thereof, high frequency voltage V, high frequency current I, high frequency phase P, and impedance Z are detected by measuring the high frequency power P applied to the lower electrode 102 using the electrical measuring instrument (e.g., a VI probe) 107C.

An electrostatic chuck 108 is arranged on the top surface of the lower electrode 102, and a direct current (DC) power source 109 is connected to the electrode plate 108A of the electrostatic chuck 108. The electrostatic chuck 108 allows high voltage to be applied from the DC power source 109 to the electrode plate 108A under a high vacuum condition, thereby electrostatically adsorbing the wafer W. A wattmeter 109a for detecting the current and voltage applied to the electrostatic chuck 108 is interposed between the electrode plate 108A of the electrostatic chuck 108 and the DC power source 109.

On the outer circumference of the lower electrode 102, a focus ring 110a for focusing plasma, generated in the upper chamber 101A, onto the wafer W is provided. An exhaust ring 111, attached to the top of the support 103, is arranged under the focus ring 110a. In the exhaust ring 111, a plurality of holes is formed around the entire circumference of the ring in a circumferential direction at regular intervals, so that gas present in the upper chamber 101A is exhausted to the lower chamber 101B through the holes.

The support 103 is moved upward or downward between the upper chamber 101A and the lower chamber 101B by the operation of a ball screw mechanism 112 and a bellows 113. When the wafer W is provided to the lower electrode 102, the support 103 moves downward up to the lower chamber 101B to open the gate valve 106, thus allowing a convenient mechanism (not shown) for providing the wafer W to the lower electrode 102. Further, a bellows cover 116 is provided on the outer side of the bellows 113.

A refrigerant flow path 103A connected to refrigerant piping 114 is formed in the support 103, thus circulating refrigerant through the refrigerant flow path 103A via the refrigerant piping 114 and maintaining the temperature of the wafer W at a predetermined value.

Gas flow paths 103B are formed through the support 103, the insulating material 102A, the lower electrode 102, and the electrostatic chuck 108. A gas introducing mechanism 115 supplies, for example, He gas, to a fine space between the electrostatic chuck 108 and the wafer W through gas piping 115A at a predetermined pressure as backside gas. Because of the He gas, the thermal conductivity between the electrostatic chuck 108 and the wafer W is increased. The pressure of the backside gas is detected by a pressure sensor (not shown), and the detected value is displayed on a manometer 115B. On the gas introducing mechanism 115, a mass flow controller (not shown), for example, is provided, and the gas flow of the backside gas can be determined by the mass flow controller.

A gas introduction mechanism 104A is formed in the top surface of the upper electrode 104. The gas introduction mechanism 104A is connected to a process gas supply system 118 through piping 117. The process gas supply system 118 contains a $C_5F_8$ gas supply source 118A, an $O_2$ gas supply source 118D, and an Ar gas supply source 118G.

The gas supply sources 118A, 118D, and 118G supply respective gases to the upper electrode 104 at predetermined flow rates through valves 118B, 118E, and 118H and mass flow controllers 118C, 118F, and 118I, respectively, and are combined to create mixed gas, having a predetermined mixture ratio, within the upper electrode 104. At the bottom surface of the upper electrode 104, a plurality of gas exhaust holes 104B is formed in the entire bottom surface at regular intervals, and mixed gas is provided as process gas by the upper electrode 104 into the upper chamber 101A through the gas exhaust holes 104B.

The processing chamber 101 is connected to an exhaust unit 119 composed of a vacuum pump, etc. through an exhaust pipe 101C. On the exhaust pipe 101C, an auto pressure controller (APC) valve 101D is provided, and the opening degree of the APC value is automatically adjusted according to the pressure of the gas in the processing chamber 101.

In this embodiment, electronic data, for example, trace data, is used for prediction. The trace data may include, for example, gas flow rates measured by the mass flow controllers 118C, 118F, and 118I, the APC opening degree of the APC value 101D, data on the current and voltage applied to the electrostatic chuck 108 detected by the wattmeter 109a, the gas pressure of the backside gas detected by the manometer 115B, a value measured by the matching unit 107A (for example, the positions of the variable condensers C1 and C2 in a matching state, and the voltage Vdc between the high frequency power supply line (electric wire) and the ground), a value measured by the electric measuring instrument (VI probe) 107C (for example, the traveling wave and reflected wave of high frequency power), etc.

(Prediction Apparatus)

Figure 2:
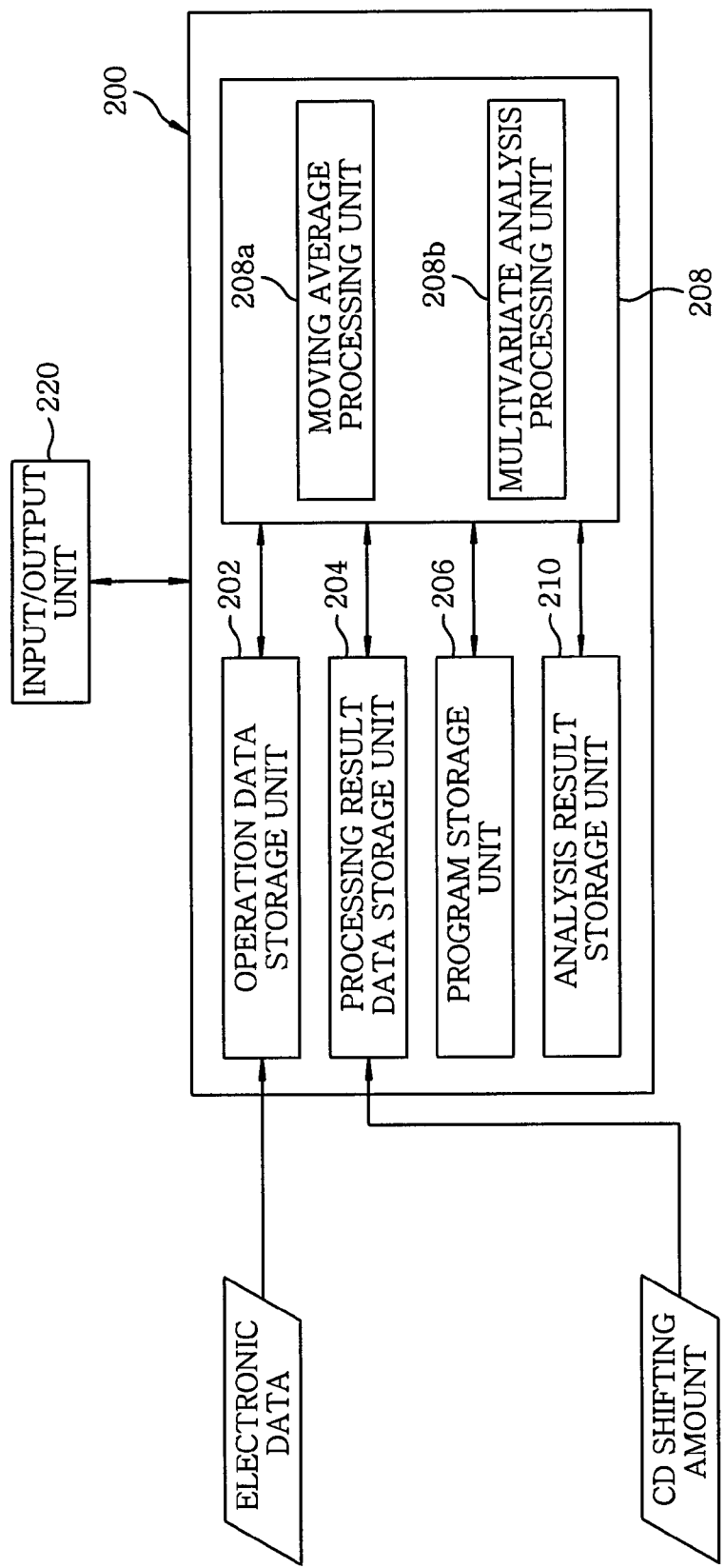
FIG. 2 is a block diagram showing a detailed example of a prediction apparatus in the plasma processing apparatus.

As shown in FIG. 2, the plasma processing apparatus 100 includes a prediction apparatus 200 and an input/output unit 220. The prediction apparatus 200 statistically processes operation data (for example, the above-described electric data) and processing result data (for example, processing characteristic data, such as data on the etched shape of a wafer after processing, and apparatus status data, such as data on the thickness of the upper electrode 104), obtains a correlation between the operation data and processing result data, and predicts both the status of the wafer W and the status of the processing chamber 101, from the operation data obtained when the wafer W is processed in the processing chamber 101, on the basis of the correlation. Further, the input/output unit 220 includes, for example, the function of assigning a command from an operator to the prediction apparatus 200, and the function of obtaining prediction results from the prediction apparatus 200 and outputting the prediction results to the outside of the plasma processing apparatus 100.

The prediction apparatus 200 includes an operation data storage unit 202, a processing result data storage unit 204, a program storage unit 206, a processing unit 208, and an analysis result storage unit 210. The operation data storage unit 202 implements a unit for storing operation data, and the processing result data storage unit 204 implements a unit for storing processing result data.

The processing unit 208 includes a moving average processing unit 208a and a multivariate analysis processing unit 208b. The moving average processing unit 208a implements a unit for obtaining a plurality of pieces of processing result data from the processing result data storage unit 204, and obtaining respective moving averages. Further, the multivariate analysis processing unit 208b implements a unit for obtaining a correlation between operation data and processing result data (for example, a prediction equation or a regression equation) through multivariate analysis, and a unit for predicting processing results (for example, processing characteristics, such as the etched shape of a wafer after processing, and apparatus status, such as the thickness of the upper electrode 104) on the basis of the correlation. The moving average processing performed by the moving average processing unit 208a and the multivariate analysis performed by the multivariate analysis processing unit 208b will be described in detail later.

The analysis result storage unit 210 implements a unit for storing the moving average value of the processing result data obtained by the moving average processing unit 208a, and the correlation and the prediction results obtained by the multivariate analysis processing unit 208b.

The processing unit 208 may be implemented by using, for example, a microprocessor operating on the basis of a program stored in the program storage unit 206. Further, the operation data storage unit 202, the processing result data storage unit 204, and the analysis result storage unit 210 may be implemented by using a recording unit, such as semiconductor memory, or may be implemented by providing respective memory areas in a recording unit such as a hard disc.

The brief operation of the prediction apparatus 200 having the above construction is described below. When operation data and processing result data are sequentially inputted into the prediction apparatus 200, the operation data storage unit 202 and the processing result data storage unit 204 accordingly store respective data therein. Next, the moving average processing unit 208a included in the processing unit 208 reads a plurality of pieces of processing result data from the processing result data storage unit 204, and obtains moving averages of respective pieces of processing result data using the moving average processing program stored in the program storage unit 206. Next, the multivariate analysis processing unit 208b included in the processing unit 208 reads a plurality of pieces of operation data from the operation data storage unit 202, performs multivariate analysis using the operation data and the plurality of pieces of processing result data, on which moving average processing has been performed by the moving average processing unit 208a, and thus obtains a relational expression (a prediction equation, such as a regression equation and a model) which indicates a correlation between the operation data and the processing result data. Further, the analysis result storage unit 210 stores the relational expression obtained by the multivariate analysis processing unit 208b.

Detection data, respectively obtained from a plurality of detectors provided in the plasma processing apparatus 100 when the wafer W is processed, can be used as operation data. Further, processing characteristic on the wafer W can be used as the processing result data. Further, the apparatus status data on the internal status of the processing chamber 101, obtained as the result of plasma processing, can also be used as the processing result data.

Processing characteristic data may include data on the shape of the processed surface of the wafer obtained as the result of the processing of the wafer W (for example, the amount of CD shift), processing rate data (for example, an etching rate), etc. The apparatus status data may include data on the degree of consumption of expendables after wafer processing has been performed, for example, the thickness of the parts in the processing chamber 101.

(Operation Data)

Operation data is intermittently measured during the processing of the wafer W, so that the processing result data is measured as needed after the wafer W has been processed. Such measurement results are stored in the operation data storage unit 202 and the processing result data storage unit 204.

In this embodiment, it is preferable to use data that can easily influence processing results (data having a strong relationship with processing results) as operation data in order to obtain the correlation between the operation data and the processing result data. In this embodiment, electronic data is used as the operation data. The above-described trace data is used as the electronic data.

Further, as described above, processing characteristic data can be used as the processing result data. As an example of processing characteristic data, there is data about etching, such as the dimensions of the shape formed by performing etching processing on the wafer W. In this embodiment, the amount of CD shift of the hole formed through etching processing is used as the processing result data.

Figure 3:
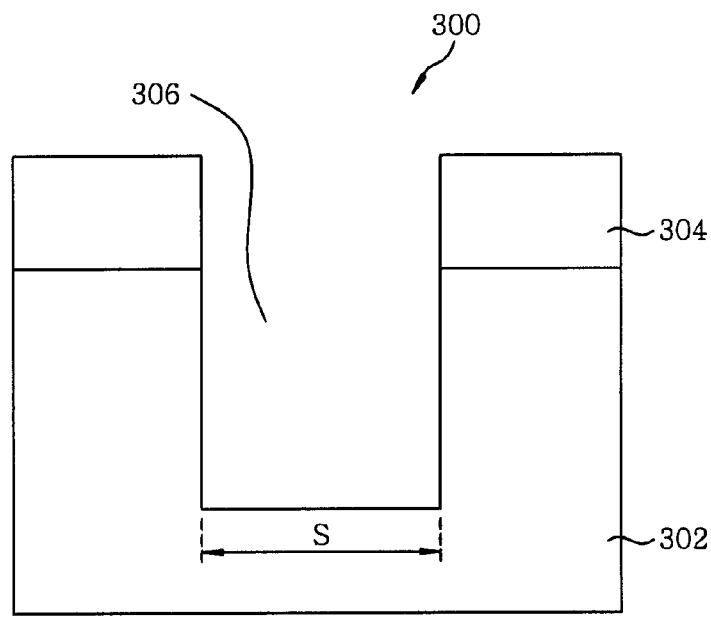
FIG. 3 is a diagram showing a detailed example of a film structure on which etching processing is performed in the plasma processing apparatus.

In this case, a detailed embodiment, in which the amount of CD shift is measured, is described. For example, etching processing is performed on the wafer W having a film structure 300, as shown in FIG. 3. The film structure 300 is implemented by forming a mask layer 304 on a silicon oxide layer (for example, a SiO$_2$ layer) 302. Predetermined etching processing is performed on such a film structure 300, and thus a hole 306 is formed in the silicon oxide layer 302. The line width S of the bottom of the hole 306 is measured after etching processing, so that the difference between the measured value and a target value (a design value) is set to be the amount of CD shift.

In this embodiment, after etching processing is performed on a wafer for analysis required to create a model through multivariate analysis (hereinafter referred to as "wafer for model creation"), the amount of CD shift is obtained, and is stored in the processing result data storage unit 204 as processing result data. Further, the wafer W having a film structure, such as a wafer required to predict processing results (a prediction wafer), is preferably used as a wafer for model creation.

(Data Collection for Analysis Processing)

In this embodiment, before a correlation (model) between operation data and processing result data is obtained through analysis processing, operation data and processing result data on a wafer for model creation are collected.

In detail, a predetermined number of wafers for model creation is prepared and carried in the processing chamber 101 one by one, and etching processing is performed on the wafers, so that data required to create a model is collected. In this case, electronic data is collected as the operation data of the plasma processing apparatus 100, and the amount of CD shift is collected from the wafers for model creation, on which etching processing has been performed, as processing result data (data collection process and data collection unit).

Electronic data is measured whenever etching processing is performed on each wafer for model creation. Further, respective pieces of electronic data are stored as operation data in the operation data storage unit 202 of the prediction apparatus 200 in association with, for example, identification information (wafer ID) previously assigned to each wafer for model creation.

The amount of CD shift is measured using, for example, a measuring instrument, for each wafer for model creation, for which etching processing has been completed. The data on the CD shift amount measured for each wafer is stored as processing result data in the processing result data storage unit 204 of the prediction apparatus 200 in association with, for example, a wafer ID.

However, in the prior art, multivariate analysis is performed using only the electronic data (operation data) collected in this way, and the data on a CD shift amount (processing result data) without processing the data, and thus a correlation (model) therebetween was obtained. However, since the amount of CD shift used to obtain the correlation is a measured value, the probability of including measurement error is high. If an error is included in the CD shift amount in this way, differences occur between respective CD shift amount values. If a correlation is obtained using the CD shift amount values including an error, the influence of the error may be applied to prediction results obtained using the correlation, and the prediction accuracy may be decreased.

Therefore, in the present invention, moving average processing is performed on processing result data, such as a CD shift amount having a high probability of including error, among a plurality of pieces of data required to obtain a correlation (model), and thus moving average processing result data is obtained. Thereafter, the correlation between the operation data and the moving average processing result data is obtained using the moving average processing result data, instead of the processing result data. Accordingly, even if error is included in the measured processing result data, the influence of the error on the correlation (model) can be reduced.

(Moving Average Processing)

Next, moving average processing in accordance with an embodiment of the present invention is described. The moving average processing is executed by the moving average processing unit 208a of the processing unit 208 on the basis of a moving average processing program stored in the program storage unit 206. In detail, the moving average processing unit 208a reads data on a CD shift amount from the processing result data storage unit 204, performs moving average processing for the data on the CD shift amount, and obtains data on the CD shift amount, on which moving average processing has been performed (moving average processing result data).

Figure 4:
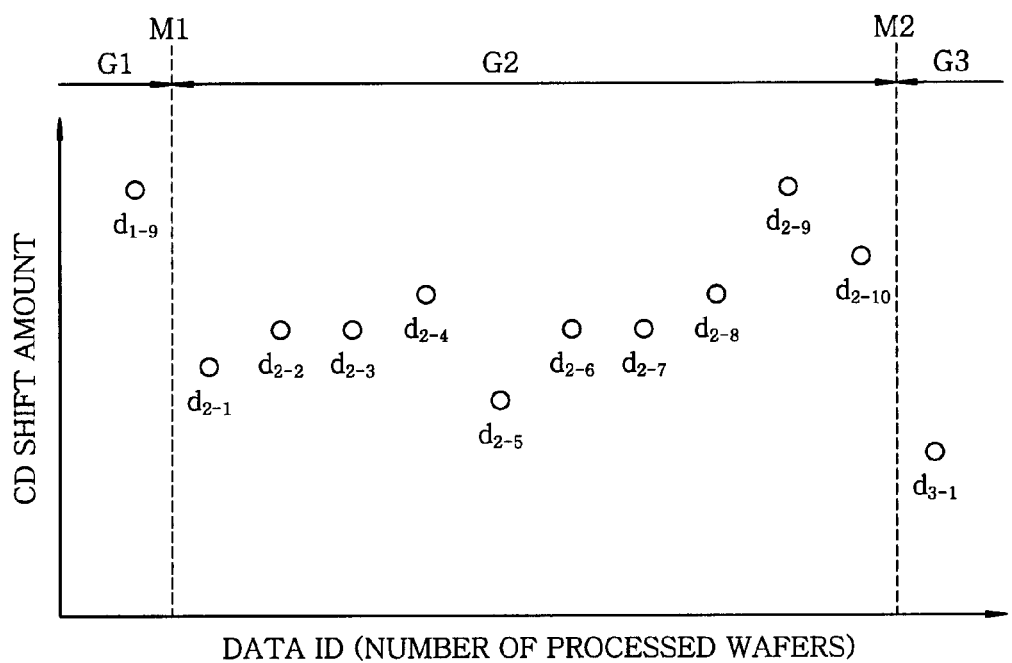
FIG. 4 is a diagram showing a detailed example of data on a critical dimension (CD) shift amount, obtained before moving average processing is performed.

In regards to this case, before moving average processing is performed, an example of the data on a CD shift amount is described with reference to FIG. 4. FIG. 4 illustrates the results of the measurement of CD shift amount values of a plurality of wafers for model creation when etching processing is performed on respective wafers for model creation. Since etching processing is performed on respective wafers for model creation under the same process conditions, CD shift amount values are uniform over all wafers for model creation. However, since the CD shift amount values are measured values as described above, differences occur between respective CD shift amount values if there is a measurement error in the CD shift amount values, as shown in FIG. 4. Further, CD shift amount values vary with time-lapse variation caused by the case where the status of the processing chamber 101 is gradually changed due to the repetition of etching processing and shift variation caused by the case where the status of the processing chamber 101 is improved by maintenance, which will be described later, in addition to the differences mainly caused by measurement error.

Maintenance influencing processing result data, such as a CD shift amount, may include, for example, the replacement of components in the processing chamber 101. The components replaced for maintenance include, for example, the upper electrode 104, the focus ring 110a, etc. Such components are worn out through the repetition of etching processing, so that the maintenance of the processing chamber 101 is performed at suitable timing. In this embodiment, when etching processing is performed on a plurality of wafers for model creation, a maintenance M is performed on the processing chamber 101 over several times. FIG. 4 illustrates an example in which maintenance is performed on the processing chamber 101 at times of M1 and M2.

(Influence of Maintenance on Processing Result Data)

If such maintenance is performed, the status of the processing chamber is improved. For example, as shown in FIG. 4, data about CD shift amount values has a tendency to vary abruptly (shift variation) before and after maintenance. For example, as shown in FIG. 4, a relatively large difference (shift variation), compared to other data, occurs between data on a CD shift amount $d_{1-9}$ obtained immediately before the maintenance M1 is performed, and data on a CD shift amount $d_{2-1}$ obtained immediately after the maintenance M1 is performed. Further, a large difference (shift variation) also occurs between data on a CD shift amount $d_{2-10}$ obtained immediately before maintenance M2 is performed, and data on a CD shift amount $d_{3-1}$ obtained immediately after maintenance M2 is performed.

Due to this, if moving average processing is performed using data that includes data about CD shift amount values obtained before and after maintenance, moving average processing result data, obtained through moving average processing, is influenced by shift variation. Accordingly, if a correlation (model) is obtained using such moving average processing result data, prediction results may be influenced by shift variation, and the prediction accuracy may be decreased.

Therefore, in the present invention, when processing result data, obtained before and after maintenance, is included in processing result data, the processing result data is divided into groups for respective sections defined by maintenance, and moving averages are obtained using processing result data belonging to a corresponding group for each group, so that moving average processing result data is obtained. For example, when a moving average is intended to be obtained for a group G2 of CD shift amount values within a section defined by maintenance M1 and maintenance M2, as shown in FIG. 4, moving averages are obtained using only the data about respective CD shift amount values $d_{2-1}$ to $d_{2-10}$, belonging to the group G2. In this case, data on a CD shift amount $d_{1-9}$ of a wafer for model creation belonging to the group G1, and data on a CD shift amount $d_{3-1}$ belonging to the group G3 is not used.

Accordingly, since the influence of processing result data, obtained before and after maintenance, on moving average processing result data can be prevented, a correlation (model) is obtained using the moving average processing result data, thus preventing the prediction accuracy from decreasing.

For this case, moving average processing performed for each group is described. In this embodiment, for each group, a moving average of a preset number of pieces of data (moving average period) is calculated while data on a considered CD shift amount is shifted by one piece, and the calculated moving average is set to moving average processing result data corresponding to the data on the considered CD shift amount. In this embodiment, for data required to obtain a moving average, data preceding the data on the considered CD shift amount is used as target data, and the number of pieces of data is set to a predetermined number (for example, 10).

According to the moving average processing, if data on a CD shift amount $d_{2-3}$ shown in FIG. 4 is assumed to be considered processing result data when the preset number of pieces of data required to obtain each moving average is, for example, 3, an average value of the data $d_{2-3}$ and two pieces of data $d_{2-2}$ and $d_{2-1}$, immediately preceding the data $d_{2-3}$, is the moving average processing result data corresponding to the considered processing result data. Thereafter, corresponding average processing result data is calculated while pieces of data on a considered CD shift amount are shifted by one piece.

However, when data required to obtain each moving average is data preceding the considered data, as described above, the case where a number of pieces of data corresponding to the number of pieces of data required to obtain each moving average cannot be obtained may occur. As an example of this case, when data on a CD shift amount $d_{2-1}$ of FIG. 4 is assumed to be considered processing result data, data $d_{1-9}$ immediately previous thereto belongs to another group, so that the data cannot be used. Even in the case of data $d_{2-2}$, the number of pieces of data $d_{2-1}$ immediately previous thereto is one, so that, even if the data $d_{2-2}$ and the data $d_{2-1}$ are summed up, only 2 pieces of data are obtained.

Therefore, in the present invention, until the number of pieces of data preceding considered processing result data reaches the preset number of pieces of data, an average value is obtained using all pieces of processing result data preceding the considered processing result data, and the obtained average value is taken as moving average processing result data corresponding to the considered processing result data. Further, if the number of pieces of data preceding the considered processing result data reaches the preset number of pieces of data or more, only a preset number of pieces of recent processing result data preceding the considered processing result data are used, and an average value thereof is obtained and is taken as moving average processing result data corresponding to the considered processing result data. Accordingly, moving average processing result data corresponding to all pieces of processing result data for each group can be calculated.

On the basis of the above description, in this embodiment, moving average processing for each group is performed in the following manner. First, in each group, until the number of pieces of data preceding data on a considered CD shift amount reaches the preset number of pieces of data (for example, 3), an average value is obtained using all pieces of CD shift amount data preceding the considered CD shift amount data, and the obtained average value is taken as a moving average value (moving average processing result data) corresponding to the considered CD shift amount data.

Further, if the number of pieces of data preceding the considered CD shift amount data reaches the preset number of pieces of data (for example, 3) or more, only a preset number (for example, 3) of pieces of recent CD shift amount data preceding the considered CD shift amount data are used, and an average value thereof is obtained and is taken as a moving average value (moving average processing result data) corresponding to the considered CD shift amount data.

For example, moving average processing that is performed based on the CD shift amount data $d_{2-1}$ to $d_{2-10}$ belonging to the group G2 of FIG. 4 is described. The case where the preset number of pieces of data required to obtain each moving average is 3 is considered. For 10 pieces of CD shift amount data belonging to the group G2, moving averages are calculated while considered CD shift amount data is shifted by one piece, with respect to the first CD shift amount data $d_{21}$ to the CD shift amount data $d_{2-10}$.

First, until the number of pieces of data preceding the considered CD shift amount data reaches 3, that is, for the CD shift amount data $d_{2-1}$, and $d_{22}$, an average value is obtained using all pieces of data preceding the considered CD shift amount data, and is taken as the moving average processing result data corresponding to the considered CD shift amount data. For example, when considered CD shift amount data is data $d_{2-1}$, the data $d_{2-1}$ is the first data of the group G2, so that the data $d_{21}$ is taken as a moving average value (moving average processing result data) without a change. Thereafter, considered CD shift amount data is shifted by one piece, and becomes the data $d_{2-2}$. An average value is obtained using the data $d_{22}$ and the data $d_{2-1}$ previous thereto, and is taken as a moving average value (moving average processing result data) corresponding to the data $d_{2-2}$.

Next, if the number of pieces of data preceding considered CD shift amount data reaches 3 or more, that is, if the considered CD shift amount data becomes the data $d_{2-3}$ or subsequent data, an average value is obtained using 3 recent pieces of data preceding the considered data, and is taken as the moving average processing result data corresponding to the data. For example, when considered CD shift amount data is data $d_{2-3}$, an average value is obtained using data $d_{2-1}$ to $d_{2-3}$, and is taken as the moving average value (moving average processing result data) corresponding to the data $d_{2-3}$. Thereafter, considered CD shift amount data is shifted by one piece, and average values are each obtained using 3 recent pieces of data preceding the considered CD shift amount data, as in the case of the data $d_{2-3}$ until the considered CD shift amount data reaches the last data $d_{2-10}$. The obtained average values are taken as moving average values (moving average processing result data).

In this way, the relationship between the data ID of considered CD shift amount data, the number of pieces of data required to obtain a moving average corresponding to the considered CD shift amount data, and the required data, (data used for moving average processing) when the preset number of pieces of data required to obtain each moving average is set to 3, is summarized and shown in the following table 1.

TABLE 1

| Data ID | Number of Data | Data Used for Moving average Processing |
|---------|----------------|----------------------------------------|
| $d_{2-1}$ | 1 | $d_{2-1}$ |
| $d_{2-2}$ | 2 | $d_{2-1}, d_{2-2}$ |
| $d_{2-3}$ | 3 | $d_{2-1} \sim d_{2-3}$ |
| $d_{2-4}$ | 3 | $d_{2-2} \sim d_{2-4}$ |
| $d_{2-5}$ | 3 | $d_{2-3} \sim d_{2-5}$ |
| . | . | . |
| . | . | . |
| . | . | . |
| $d_{2-9}$ | 3 | $d_{2-7} \sim d_{2-9}$ |
| $d_{2-10}$ | 3 | $d_{2-8} \sim d_{2-10}$ |

Further, even when the preset number of pieces of data required to obtain each moving average is set to 5 or 10, moving average values (moving average processing result data) can be obtained, similar to the case where the number of pieces of data is set to 3. The relationships between the data ID of considered CD shift amount data, the number of pieces of data required to obtain a moving average corresponding to the considered CD shift amount data, and the required data (data used for moving average processing) when the preset number of pieces of data required to obtain each moving average is set to 5 and 10, respectively, are summarized and shown in the following tables 2 and 3.

TABLE 2

| Data ID | Number of Data | Data Used for Moving average Processing |
|---|---|---|
| $d_{2-1}$ | 1 | $d_{2-1}$ |
| $d_{2-2}$ | 2 | $d_{2-1}, d_{2-2}$ |
| $d_{2-3}$ | 3 | $d_{2-1} \sim d_{2-3}$ |
| $d_{2-4}$ | 4 | $d_{2-1} \sim d_{2-4}$ |
| $d_{2-5}$ | 5 | $d_{2-1} \sim d_{2-5}$ |
| $d_{2-6}$ | 5 | $d_{2-2} \sim d_{2-6}$ |
| . | . | . |
| . | . | . |
| . | . | . |
| $d_{2-9}$ | 5 | $d_{2-5} \sim d_{2-9}$ |
| $d_{2-10}$ | 5 | $d_{2-6} \sim d_{2-10}$ |

TABLE 3

| Data ID | Number of Data | Data Used for Moving average Processing |
|---|---|---|
| $d_{2-1}$ | 1 | $d_{2-1}$ |
| $d_{2-2}$ | 2 | $d_{2-1}, d_{2-2}$ |
| $d_{2-3}$ | 3 | $d_{2-1} \sim d_{2-3}$ |
| $d_{2-4}$ | 4 | $d_{2-1} \sim d_{2-4}$ |
| $d_{2-5}$ | 5 | $d_{2-1} \sim d_{2-5}$ |
| $d_{2-6}$ | 6 | $d_{2-1} \sim d_{2-6}$ |
| . | . | . |
| . | . | . |
| . | . | . |
| $d_{2-9}$ | 9 | $d_{2-2} \sim d_{2-9}$ |
| $d_{2-10}$ | 10 | $d_{2-1} \sim d_{2-10}$ |

According to an embodiment, since CD shift amount data belonging to other groups are not used, and moving average processing result data corresponding to respective pieces of CD shift amount data are obtained, the moving average processing result data are not prevented from being influenced by the variation in status of the processing chamber 101 attributable to maintenance. Accordingly, a correlation (model) between the moving average processing result data and operation data is obtained using the moving average processing result data, thus improving the reliability of the correlation (model), and consequently improving the prediction accuracy.

Further, the number of pieces of data used for moving average processing is adjusted for each CD shift amount, so that moving average values corresponding to respective CD shift amount values can be obtained using as many pieces of CD shift amount data as possible within the range of the basic number of pieces of data. The moving average values corresponding to respective CD shift amount values obtained in this way minimize the measurement differences in CD shift amount, so that the reliability of a model created using the moving average values may be improved.

Figure 5:
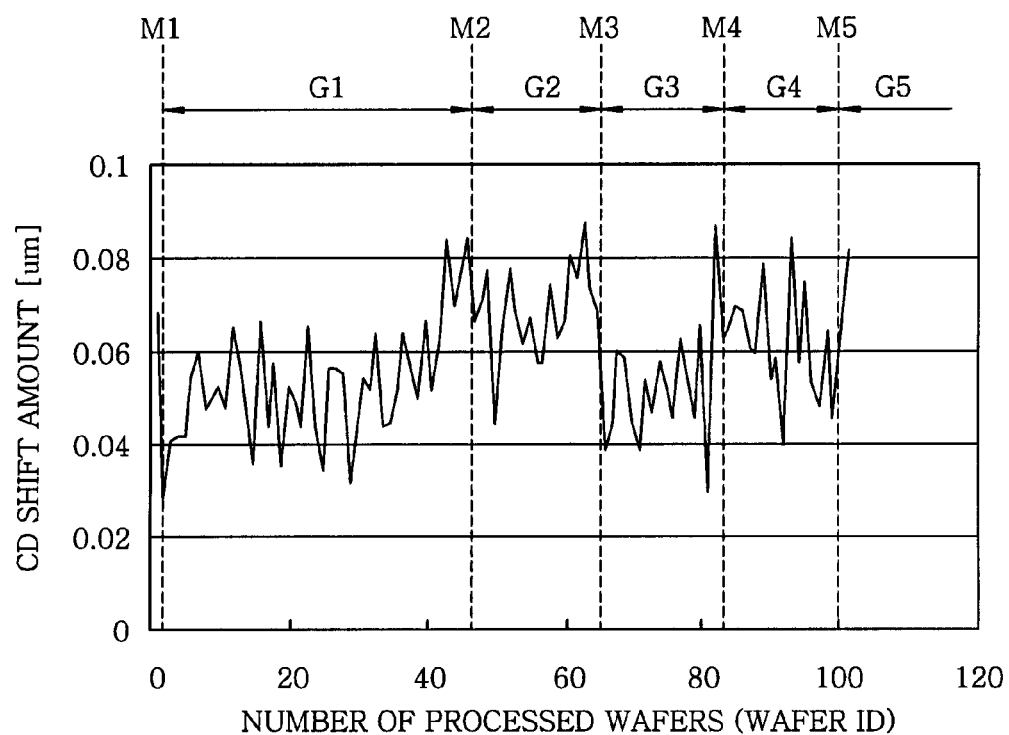
FIG. 5 is a diagram showing CD shift amount values obtained before moving average processing is performed.

Next, the results of experiment, conducted when moving average processing according to this embodiment is performed using actual processing result data, are described with reference to the drawings. In this case, moving average processing is performed on, for example, CD shift amount data, as shown in FIG. 5. FIG. 5 illustrates the case where etching processing is performed on 101 wafers for model creation and data, obtained by measuring the CD shift amount of the holes formed in respective wafers for model creation, is represented by a graph of broken lines. Such CD shift amount data corresponds to data obtained before moving average processing is performed.

In an example of FIG. 5, after first maintenance M1, etching processing is continuously performed on the 1st to the 46th wafers for model creation, and thereafter, second maintenance M2 is performed. After the second maintenance M2, etching processing is continuously performed on the 47th to the 64th wafers for model creation, and thereafter third maintenance M3 is performed. After the third maintenance M3, etching processing is continuously performed on the 65th to the 84th wafers for model creation, and thereafter fourth maintenance M4 is performed. Further, after the fourth maintenance M4, etching processing is continuously performed on the 85th to the 99th wafers for model creation, and thereafter the 15th maintenance M5 is subsequently performed.

Therefore, in the embodiment of FIG. 5, a data group of CD shift amount data obtained from first to the 46th wafers for model creation is assigned to a first group G1, and a data group of CD shift amount data obtained from the 47th to the 64th wafers for model creation is assigned to a second group G2, a data group of CD shift amount data obtained from 65th to 84th wafers for model creation is assigned to a third group G3, a data group of CD shift amount data obtained from the 85th to the 99th wafers for model creation is assigned to a fourth group G4, and a data group of CD shift amount data obtained from the 100th and subsequent wafers for model creation is assigned to a fifth group G5.

The CD shift amount data obtained before moving average processing is performed, as shown in FIG. 5, has differences vertically fluctuating by an amount of about 0.05 µm. A cause of the differences in CD shift amount is considered to be the great influence of measurement error occurring when a CD shift amount is measured, as described above. In this embodiment, moving average values corresponding to the CD shift amount of 101 wafers for model creation are obtained by the moving average processing unit 208a, thus obtaining moving average processing result data in which differences in the CD shift amount data can be minimized.

Figure 6:
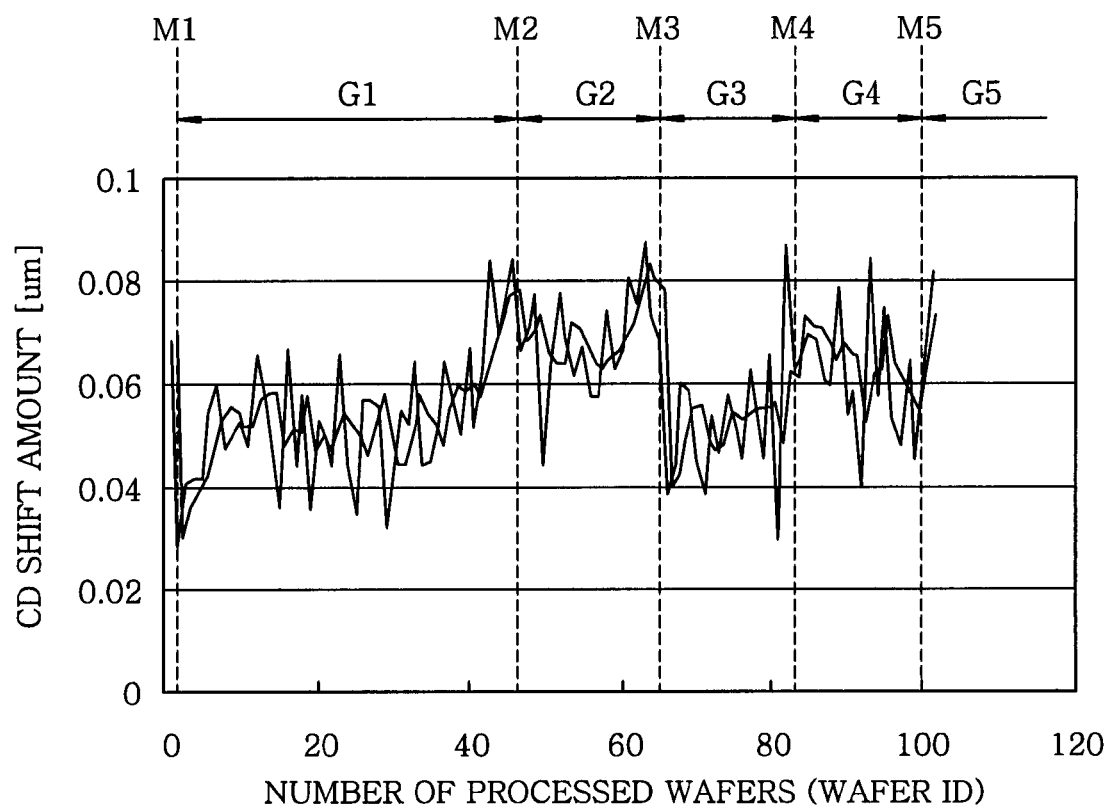
FIG. 6 is a diagram showing data about CD shift amount values when the number of pieces of data required to obtain each moving average is set to 3, and moving average processing is performed.
Figure 7:
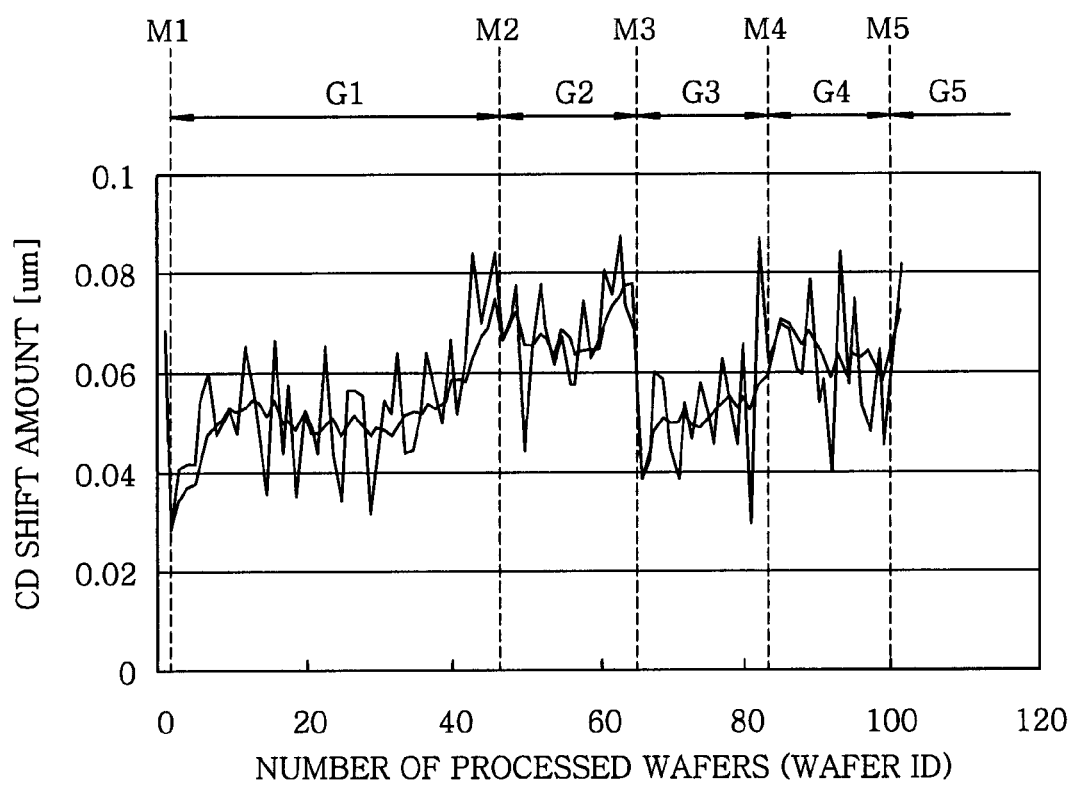
FIG. 7 is a diagram showing data about CD shift amount values when the number of pieces of data required to obtain each moving average is set to 5, and moving average processing is performed.
Figure 8:
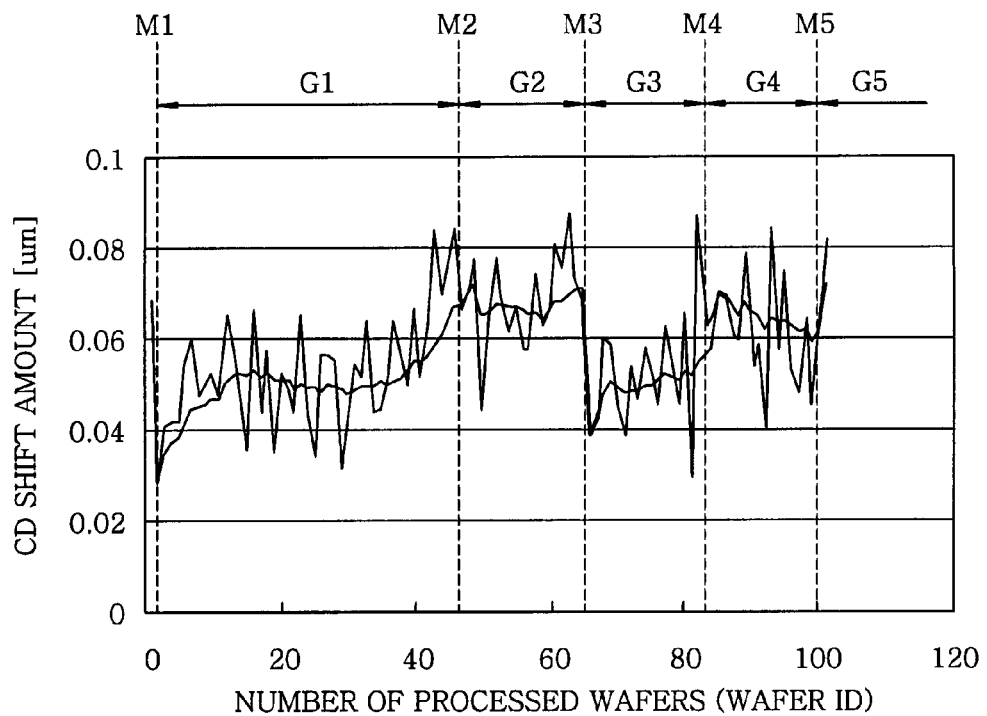
FIG. 8 is a diagram showing data about CD shift amount values when the number of pieces of data required to obtain each moving average is set to 10, and moving average processing is performed.

In this case, for CD shift amount data shown in FIG. 5, the results of experiment, obtained when the numbers of pieces of data required to obtain each moving average are set to 3, 5, and 10 and the above-described moving average processing is performed on the data, are shown in FIGS. 6, 7 and 8, respectively. FIGS. 6 to 8 illustrate graphs of broken bold lines indicating data about moving average values (moving average processing result data) corresponding to CD shift amount values, obtained through moving average processing. Further, for comparison with moving average processing result data, FIGS. 6 to 8 illustrate CD shift amount data, obtained before moving average processing is performed, in the form of graphs with thin lines.

When moving average processing result data (bold lines) shown in FIGS. 6 to 8 are compared to the CD shift amount data (thin lines) obtained before moving average processing is performed, the differences in CD shift amount are made uniform by performing moving average processing on each piece of CD shift amount data, so that a factor such as an error can be eliminated, and thus the reliability of data after moving average processing has been performed are improved.

Further, when FIGS. 6 to 8 are compared with each other, it can be seen that, as the number of pieces of data required to obtain each moving average increases to, for example, 3, 5, and 10, the differences in CD shift amount can be more uniform. Accordingly, from the standpoint of the fact that the reliability of the CD shift amount is intended to be improved by minimizing the differences attributable to measurement error, it is preferable that the number of pieces of data required to obtain each moving average be set to a higher value.

However, as described above, when moving averages are required for each group (for example, G1 to G4), it is difficult for respective pieces of CD shift amount data to be considered in the moving average values if the number of pieces of data required to obtain each moving average is set to a value that is excessively higher than the total number of pieces of data existing in a corresponding group, so that the precision of a model obtained from the moving averages may be decreased. Further, if the number of pieces of data required to obtain each moving average is set to a high value, the time taken for the moving average processing unit 208a to perform calculation increases. Therefore, it is preferable that, in order to efficiently create a reliable model, the number of pieces of data required to obtain each moving average be set to a suitable number.

According thereto, it is preferable that the number of pieces of data required to obtain each moving average be set, for example, according to the number of wafers (in this case, 101) for model creation on which etching processing is performed. Further, in this embodiment, the case where the numbers of pieces of data required to obtain each moving average are set to be equal to each other for all groups (for example, G1 to G4) has been described, but the present invention is not necessarily limited to this embodiment, and it is possible to set the numbers of pieces of data required to obtain each moving average to different values for respective groups depending on the number of pieces of CD shift amount data belonging to each group. For example, the number of pieces of data required to obtain each moving average for the group G1, to which pieces of CD shift amount data corresponding to 46 wafers belongs, may be set to a larger number than that for the group G2, to which pieces of CD shift amount data corresponding to 18 wafers belongs. Therefore, since the optimal number of pieces of data corresponding to the number of pieces of CD shift amount data belonging to each group is set to the number of pieces of data required to obtain each moving average, the differences in CD shift amount for each group can be more efficiently minimized, and thus the influence of measurement error for CD shift amount or the like can be minimized.

Further, the number of pieces of data required to obtain each moving average may be defined in the moving average processing program stored in the program storage unit 206. In this case, the moving average processing program may adjust the number of pieces of data required to obtain each moving average according to the total number of wafers for model creation, or the number of wafers for model creation belonging to each group. Further, the operator of the plasma processing apparatus 100 may set the number of pieces of data required to obtain each moving average using the input/output unit 220.

In this embodiment, the moving average corresponding to considered CD shift amount data is calculated using CD shift amount data preceding the considered CD shift amount data, but the present invention is not limited to this embodiment, and it is possible to calculate the moving average using data including CD shift amount data that follows the considered CD shift amount data. Further, it is also possible to calculate the moving average using CD shift amount data both preceding and following the considered CD shift amount data, and to calculate the moving average using CD shift amount data following the considered CD shift amount data.

As described above, multivariate analysis is performed by the multivariate analysis processing unit 208b on moving average values of CD shift amount data of all wafers model creation obtained by the moving average processing unit 208a (moving average processing result data), along with the electronic data stored in the operation data storage unit 202.

(Multivariate Analysis Processing)

Next, in the present embodiment, multivariate analysis processing performed by the prediction apparatus 200 is described. The prediction apparatus 200 uses various types of operation data as description variates (description variables), and thus obtains the following relational expression (prediction equation, such as regression equation or model) (1-1) that uses processing result data as variates to be described (target variates or target variables), using a multivariate analysis program. In the following regression equation (1-1), X denotes a matrix of description variables, and Y denotes a matrix of target variables. Further, B denotes a regression matrix derived from the coefficients (weights) of the description variables, and E denotes a residual matrix.

$$Y = BX + E \tag{1-1}$$

In this embodiment, when the regression equation (1-1) is obtained, for example, a Partial Least Squares (PLS) method is used as multivariate analysis. An example of this PLS method is disclosed in JOURNAL OF CHEMOMETRICS, VOL. 2 (PP211-228)(1998). According to this PLS method, if only a small number of measured values exists in each of the matrices X and Y even though a plurality of description variables and target variables is included in each of the matrices X and Y, a correlation equation between the X and Y matrices can be obtained. Moreover, the PLS method is characterized in that, even in the case of a correlation equation obtained using a small number of measured values, high stability and reliability can be obtained.

The program storage unit 206 stores a program for the PLS method therein, and the multivariate analysis processing unit 208b belonging to the processing unit 208 processes electronic data (operation data) and moving-averaged CD shift amount data (moving average processing result data) according to the sequence of the program, thus obtaining the equation (1-1). Further, the results of analysis are stored in the analysis result storage unit 210. Further, in this embodiment, if the regression equation (1-1) is obtained, processing results can be predicted by matching the electronic data (operation data) with the matrix X as description variables. Further, the predicted value has high reliability.

For example, an i-th main component corresponding to an i-th eigenvalue for an $X^T Y$ matrix is represented by $t_i$. A matrix X is represented by the following equation (1-2) using the score $t_i$ and the vector $p_i$ of the i-th main component, and a matrix Y is represented by the following equation (1-3) using the score $t_i$ and the vector $C_i$ of the i-th main component. Further, in the following equations (1-2) and (1-3), $X_{i+1}$ and $Y_{i+1}$ are residual matrices of X and Y, and $X^T$ is a transposed matrix of the matrix X, where the index 'T' denotes a transposed matrix.

$$X = t_1 p_1 + t_2 p_2 + t_3 p_3 + \ldots + t_i p_i + X_{i+1} \tag{1-2}$$

$$Y = t_1 c_1 + t_2 c_2 + t_3 c_3 + \ldots + t_i c_i + Y_{i+1} \tag{1-3}$$

The PLS method used in this embodiment is a technique for calculating a plurality of eigenvalues and respective eigenvectors when the equation (1-2) and the equation (1-3) are correlated with each other, using a small amount of computational work.

The PLS method is performed according to the following sequence. First, at the first step, centering and scaling for matrices X and Y are performed. Further, i=1 is set, so that $X_1=X$, and $Y_1=Y$ are obtained. Further, the first column of the matrix Y1 is set to $u_1$. Centering is an operation of subtracting an average value of respective values in each row from each value in the row, and scaling is an operation (processing) of dividing each value in each row by the standard deviation of the row.

At the second step, $w_i=X_i^T u_i/(u_i^T u_i)$ is obtained, and the determinant of $w_i$ is normalized to obtain $t_i=X_i w_i$. Further, the same processing is performed on the matrix Y to obtain $c_i=Y_i^T t_i/(t_i^T t_i)$, and the determinant of $c_i$ is normalized to obtain $u_i=Y_i c_i/(c_i^T c_i)$.

At the third step, X loading (load amount) $p_i=X_i^T t_i/(t_i^T t_i)$, and Y loading $q_i=Y_i^T u_i/(u_i^T u_i)$ are obtained. Further, if $b_i=u_i^T t_i/(t_i^T t_i)$, in which u regresses to t, is obtained. Then, the residual matrix $X_i=X_i-t_i p_i^T$, and residual matrix $Y_i=Y_i-b_i t_i c_i^T$ are obtained. Further, i is increased, and i=i+1 is set, so that the steps starting from the second step are repeated. The series of these processing operations is repeated until a corresponding stop condition is satisfied according to the program of the PLS method, or until the residual matrix $X_{i+1}$ reaches zero "0", so that the maximum eigenvalue of the residual matrix and the eigenvector thereof are obtained.

According to the PLS method, since the residual matrix $X_{i+1}$ promptly satisfies the stop condition or reaches zero, the residual matrix satisfies the stop condition or reaches zero when calculations are repeated only about 10 times. In general, the residual matrix satisfies the stop condition or reaches zero when calculations are repeated 4 to 5 times. The first main component of the $X^T Y$ matrix is obtained using the maximum eigenvalue and the eigenvector thereof obtained through the calculation processing, and thus the maximum correlation between the X matrix and the Y matrix can be determined.

(Operation of Plasma Processing Apparatus)

Next, the operation of the plasma processing apparatus 100 is described. In this embodiment, electronic data is measured while etching processing is performed on a predetermined number of wafers for model creation, so that the CD shift amount of the etching-processed wafers for model creation is measured (data collection process and data collection unit). Next, the moving average values of respective CD shift amount values are obtained (moving average processing process and moving average processing unit), so that a correlation (the regression equation (1-1)) between the operation data and moving-averaged CD shift amount data (moving average processing result data) is obtained through multivariate analysis, for example, a PLS method (analysis process and analysis unit). Further, the processing of a wafer other than the wafers for model creation, that is, the wafer W required to predict processing results, such as a wafer for a product (hereinafter, referred to as "wafer for prediction") is performed using the regression equation (1-1). At the processing step for the wafer W for prediction, processing status at an arbitrary time point (for example, the status of the wafer W for prediction, and the status of the plasma processing apparatus 100) can be predicted by matching the operation data at that time point with the correlation (regression equation (1-1)) (prediction process and prediction unit). Further, the wafer for prediction is preferably implemented by using a wafer having a film structure, such as the wafers for model creation.

If the operation of the plasma processing apparatus 100 is initiated, the wafer W is carried in the gate opened by the gate valve 106 and is loaded onto the lower electrode 102 at the same time that the support 103 moves downward up to the lower chamber 101B of the processing chamber 101 through the ball screw mechanism 112. After the wafer W is carried in the chamber, the exhaust unit 119 is operated at the same time that the gate valve 106 is closed, and thus the inside of the processing chamber 101 is maintained at a predetermined vacuum level. At this time, He gas is supplied from the gas introducing mechanism 115 as back gas at a center pressure of 15 Torr and an edge pressure of 40 Torr, and the thermal conductivity between the wafer W and the lower electrode 102, in detail, between the electrostatic chuck 108 and the wafer W, is improved, and thus the cooling efficiency of the wafer W is improved. Further, the temperature of the upper electrode is set to 60° C., the temperature of the lower electrode is set to 20° C., and the temperature of the sidewall is set to 60° C.

Meanwhile, process gas is supplied by the process gas supply system 118. In detail, $C_5F_8$ gas, $O_2$ gas, and Ar gas are supplied at the flow rates of 29 sccm/750 sccm/47 sccm, respectively. The pressure of the inside of the processing chamber 101 at that time is, for example, 25 mT. In this state, high frequency power having a frequency of 60 MHz is applied to the upper electrode 104 at 3300W by, for example, the high frequency power source 104E. High frequency power having a frequency of 2 MHz is applied to the lower electrode 102 at 3800 W by, for example, the high frequency power source 107. Accordingly, the plasma of process gas is generated, and thus the oxide film of the wafer W is etched. After etching has been terminated, the processed wafer W is carried out from the processing chamber 101 through an operation that is the reverse of the carrying-in operation, and a subsequent wafer W undergoes the same processing, so that a predetermined number of wafers is processed, and a series of processing operations is terminated. Further, the operation of the plasma processing apparatus 100 is performed the same for the etching processing on wafers for model creation and the etching processing on wafers for prediction.

(Results of Prediction Experiment)

Figure 9A:
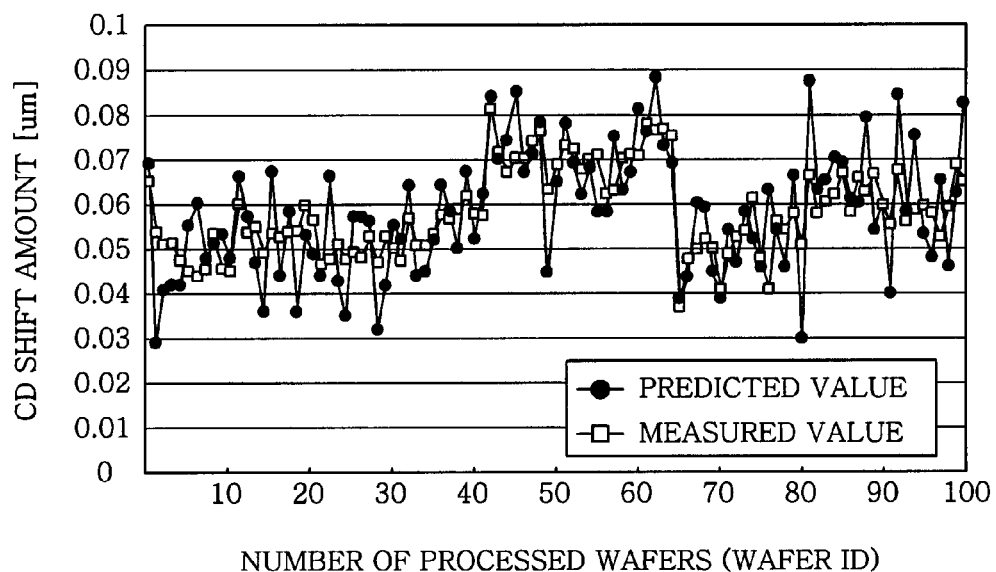
FIG. 9A is a diagram showing the comparison of a predicted value, obtained from a model created from CD shift amount values, on which moving average processing was not performed, with a measured value.
Figure 9B:
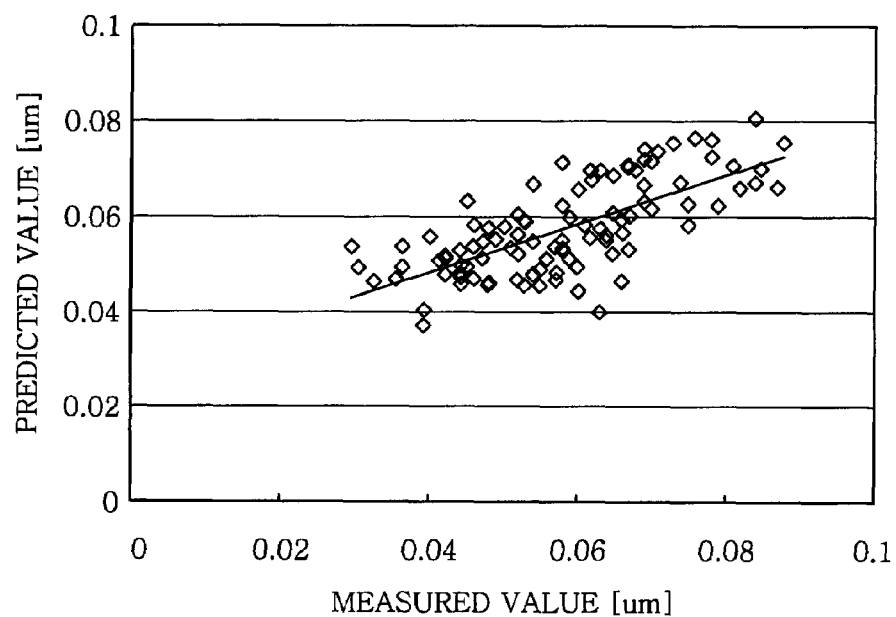
FIG. 9B is a diagram showing a correlation between the predicted value and the measured value of FIG. 9A.

Next, the results of prediction experiment on CD shift amount based on the correlation obtained using such moving-averaged data according to this embodiment are described with reference to the drawings. In this case, a description is made by comparing the results of the experiment with those of prediction of CD shift amount based on the correlation obtained using data for which moving average processing was not performed (FIGS. 9A and 9B). Further, when moving average processing was performed, the experiment was conducted under the condition in which the numbers of pieces of data required to obtain each moving average were 3, 5, and 10, respectively. The results of the experiment are shown in FIGS. 10A and 10B, FIGS. 11A and 11B, and FIGS. 12A, and 12B, respectively.

The graphs of FIGS. 9A, 10A, 11A, and 12A indicate the comparison of the predicted values with the measured values of the CD shift amount of etching holes formed in wafers for prediction. Further, the graphs of FIGS. 9B, 10B, 11B and 12B indicate the correlations between the predicted values and measured values for the CD shift amount.

The graphs of FIGS. 9A and 9B indicate the results of experiment obtained in the case where a correlation (regression equation (1-1)) is obtained using the CD shift amount itself of the etching-processed wafers for model creation without performing moving average processing on the CD shift amount, and the CD shift amount of the wafers W for prediction is predicted on the basis of the correlation. In relation to this, the graphs of FIGS. 10A and 10B to FIGS. 12A and 12B indicate the results of experiment obtained in the case where the numbers of pieces of data required to obtain each moving average are set to 3, 5, and 10, respectively, a correlation (regression equation (1-1)) is obtained using moving average processing result data, which has been obtained by performing moving average processing on the CD shift amount data of the wafers for model creation, and the CD shift amount of the wafers W for prediction is predicted on the basis of the correlation.

If the results of experiment in which moving average processing is not performed (FIGS. 9A and 9B) are compared to the results of experiment in which moving average processing is performed (FIGS. 10A and 10B to FIGS. 12A and 12B), it can be seen that predicted values close to measured values can be obtained with respect to the CD shift amount of the wafers for prediction by performing moving average processing on the CD shift amount.

Further, if the results of experiment in which the numbers of pieces of data required to obtain each moving average are set to 3, 5 and 10 are compared to each other, it can be seen that, as the number of pieces of data required to obtain each moving average is set to a larger value, the overall precision of the predicted values is improved. Further, through this experiment, no great difference appears in the prediction accuracy between the case where the number of pieces of data required to obtain each moving average is set to 5 (FIGS. 11A and 11B) and the case where the number of pieces of data is set to 10 (FIGS. 12A and 12B). This shows that, in each experiment, the maximum number of pieces of CD shift amount data divided into respective groups G is 46, and an excellent model can be created even if the number of pieces of data required to obtain each moving average is not increased up to 10. Further, as described above, if the number of pieces of data required to obtain each moving average is set to an excessively high value, it is difficult for respective CD shift amount values to be considered in moving average values, and the time taken to calculate moving average values is increased, so that it is preferable to suitably set the number of pieces of data required to obtain each moving average in order to efficiently create a highly reliable model. For example, the number of pieces of data required to obtain each moving average may be set, for example, within the range between 2 and 10.

In order to observe the relationship between predicted values and measured values in detail, a correlation coefficient R was calculated based on the results of experiment of FIGS. 9A and 9B to 12A and 12B. In this case, the term 'correlation coefficient R' unit one of indices indicating the strength of the relationship between two variables x and y, and a correlation coefficient $R_{xy}$ is represented by the following equation (2-1).

$$R_{xy} = \frac{S_{xy}}{\sqrt{S_x S_y}} = \frac{\Sigma(X_i - x)(Y_i - y)}{\sqrt{\Sigma(X_i - x)^2(Y_i - y)}} \quad (2\text{-}1)$$

In equation (2-1), $S_{xy}$ is a covariance, and $S_x$ and $S_y$ are standard deviations. Such a correlation coefficient R has a value equal to or less than "1", and indicates that, as this value gets close to "1", the correlation between the variables x and y is high.

Further, a determination coefficient $R^2$ was calculated. The determination coefficient $R^2$ is one of the bases indicating the advantages suitable for a regression equation, and is represented by the following equation (2-2).

$$R^2 = \frac{S_R}{S_T} = \frac{\Sigma(Y_i - y)^2}{\Sigma(y_i - y)^2} \quad (2\text{-}2)$$

In the above equation (2-2), $S_T$ denotes total variance, and $S_R$ denotes the variance of a part described by the regression equation. Such a determination coefficient $R^2$ is determined to be a value satisfying $0 \leq R^2 \leq 1$. Such a correlation coefficient $R^2$ is most preferable at "1", and indicates that, as this value increases, an advantage suitable for the regression equation is high. Further, the determination coefficient $R^2$ is equal to a square of the correlation coefficient R.

The correlation coefficient R and the determination coefficient $R^2$, calculated from the results of experiment of FIGS. 9A and 9B to FIGS. 12A and 12B, are summarized and represented in the following Table 4.

TABLE 4

Figure 10A:
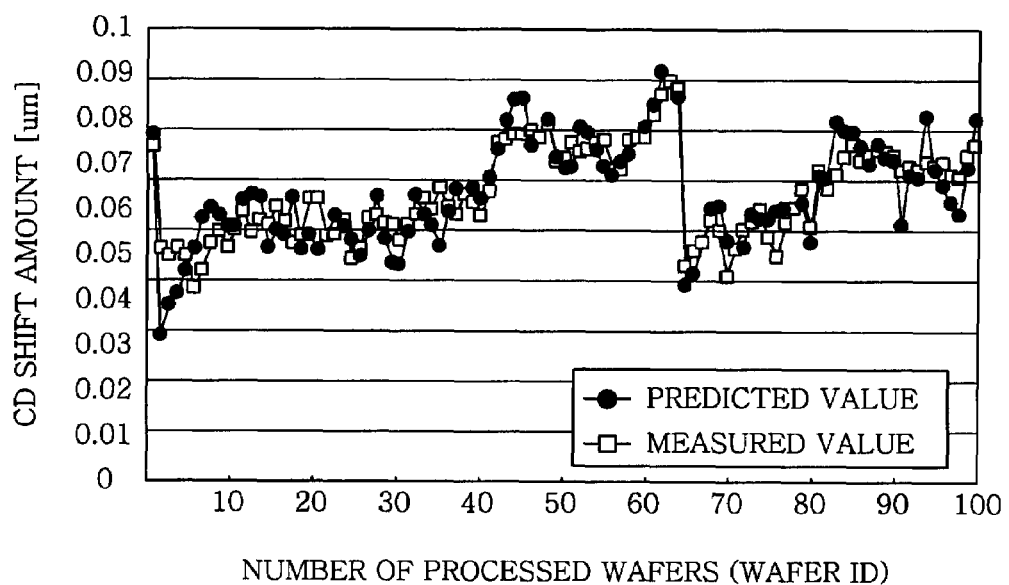
FIG. 10A is a diagram showing the comparison of a predicted value, obtained from a model created from CD shift amount values, on which moving average processing has been performed based on the basic number of pieces of data "3" with a measured value.
Figure 10B:
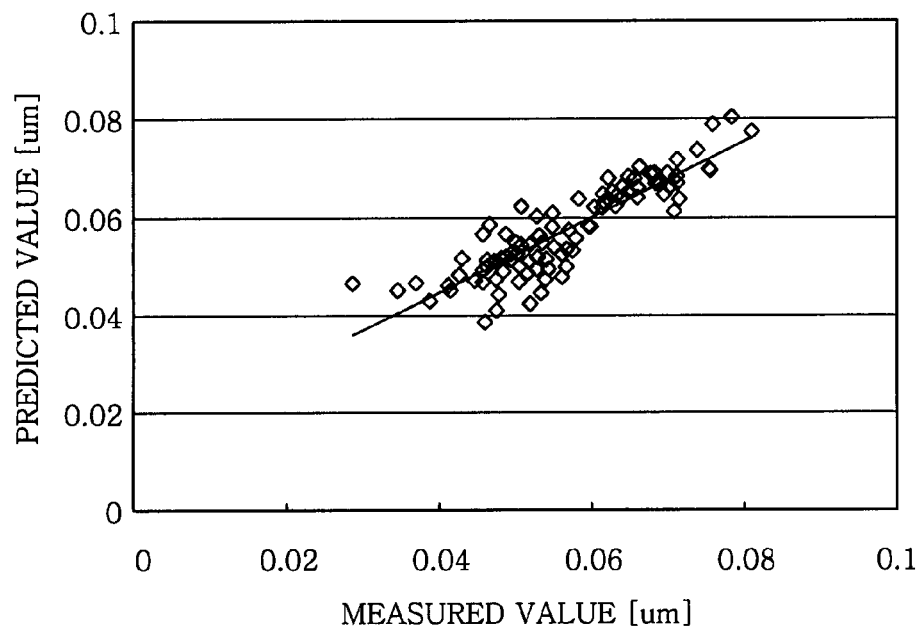
FIG. 10B is a diagram showing a correlation between the predicted value and the measured value of FIG. 10A.
Figure 11A:
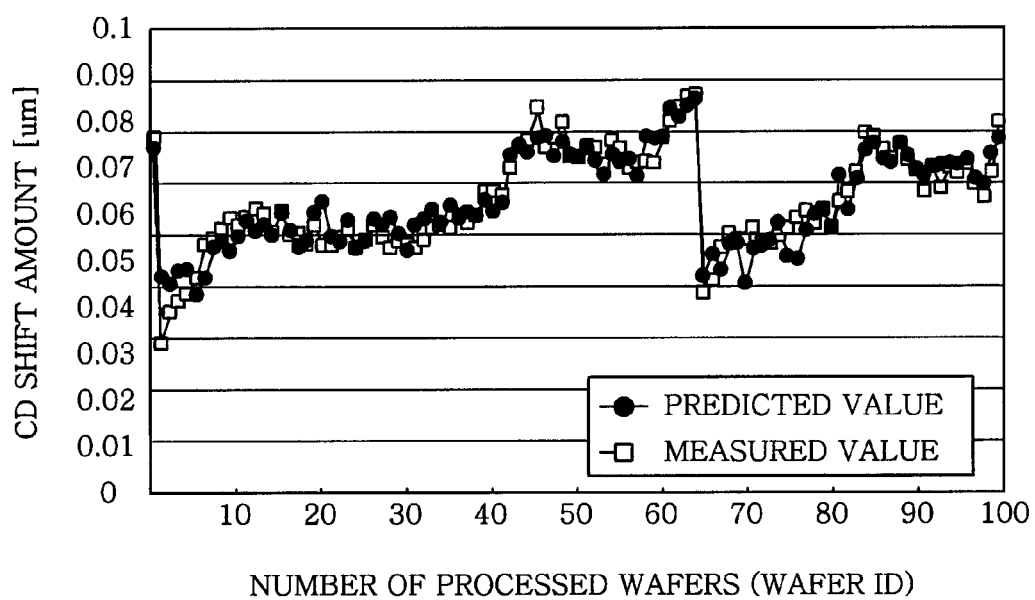
FIG. 11A is a diagram showing the comparison of a predicted value, obtained from a model created from CD shift amount values, on which moving average processing is performed based on the basic number of pieces of data "5", with a measured value.
Figure 11B:
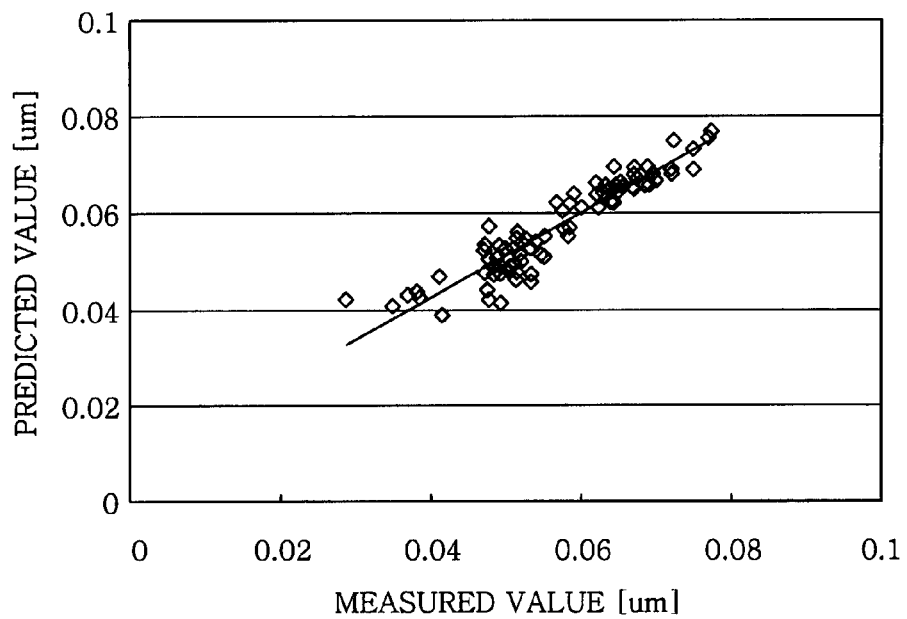
FIG. 11B is a diagram showing a correlation between the predicted value and the measured value of FIG. 11A.
Figure 12A:
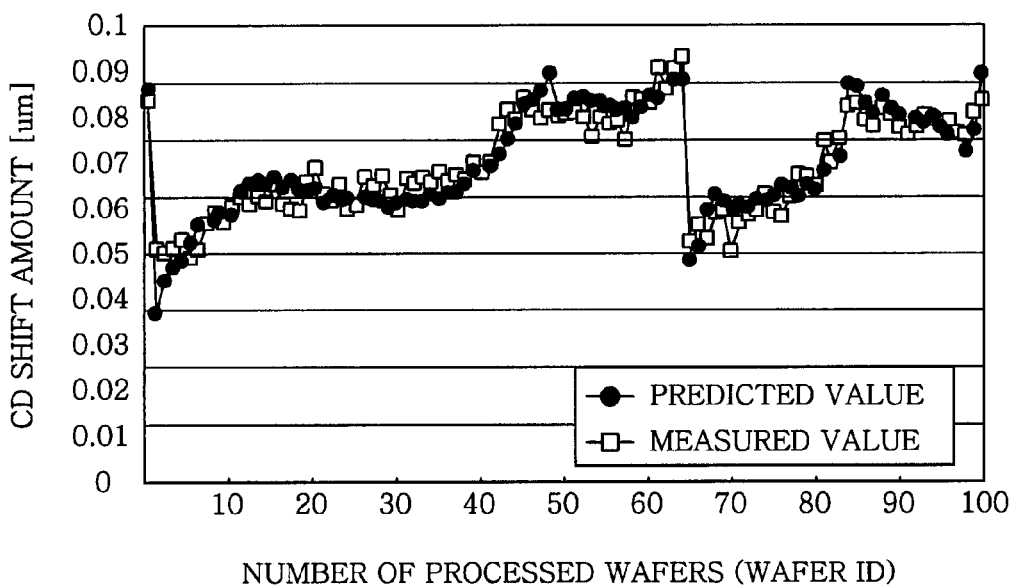
FIG. 12A is a diagram showing the comparison of a predicted value, obtained from a model created from CD shift amount values, on which moving average processing is performed based on the basic number of pieces of data "10", with a measured value.
Figure 12B:
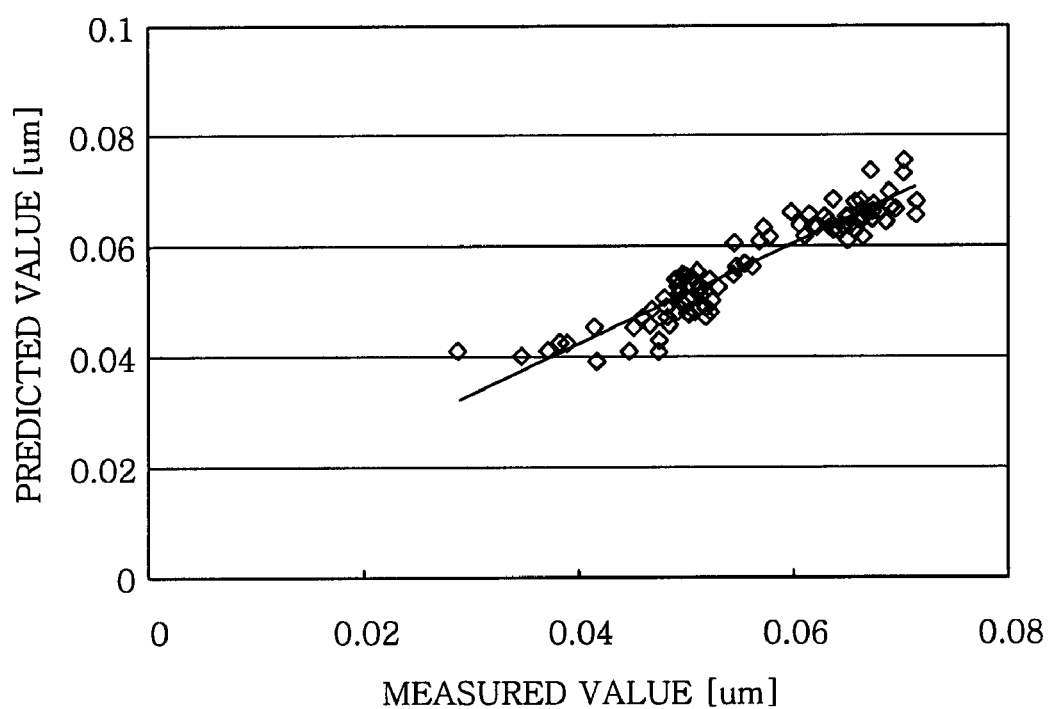
FIG. 12B is a diagram showing a correlation between the predicted value and the measured value of FIG. 12A.

| | Number of Pieces of Data Required to Obtain Each Moving average | | | |
|---|---|---|---|---|
| | Moving Average N/A FIGS. 9A & 9B | 3 FIGS. 10A & 10B | 5 FIGS. 11A & 11B | 10 FIGS. 12A & 12B |
| R | 0.71 | 0.88 | 0.94 | 0.94 |
| $R^2$ | 0.50 | 0.77 | 0.88 | 0.88 |

In summary, as the correlation coefficient R is close to "1" and the correlation coefficient $R^2$ is close to "1", the prediction accuracy is high. Thus, referring to Table 4, it can be seen that, in the case where moving average processing is performed on a CD shift amount, both the correlation coefficient R and the determination coefficient $R^2$ approximate "1". From the above results, it can be seen that the prediction accuracy is improved by performing moving average processing on the CD shift amount. Further, it can be seen that the prediction accuracy is also improved by increasing the number of pieces of data required to obtain each moving average.

Further, the correlation coefficient R or the determination coefficient $R^2$ can be used as criteria for evaluating the reliability of prediction. For example, if the determination coefficient $R^2$=0.7 is placed in the criteria, prediction reliability can be determined to be excellent for any cases where the numbers of pieces of data required to obtain each moving average are 3, 5, and 10.

Further, if determination is performed on the basis of the correlation coefficient R and the correlation coefficient R2, the prediction accuracy, obtained when the number of pieces of data required to obtain each moving average is 5, and the prediction accuracy, obtained when the number of piece of data is 10, are identical to each other. Therefore, from the standpoint of shortening the time taken to perform moving average processing, it is preferable that the number of pieces of data required to obtain each moving average be set to 5 under the conditions of this experiment.

(Operation of Results of Prediction)

Next, an operation method using the results of prediction is described. In this example, the CD shift amount of a wafer W can be monitored using the predicted value for the CD shift amount obtained according to the present embodiment. In detail, whether the CD shift amount falls within a predetermined allowable error range is determined using, for example, the predicted value for the CD shift amount. If it is determined that the CD shift amount departs from the allowable error range, error processing, such as notification, is performed. In this case, through this experiment, the most preferable results could be obtained. The operation of the results of prediction obtained when the number of pieces of data required to obtain each moving average is set to 5 is described with reference to FIG. 13.

When the CD shift amount is monitored based on the results of prediction using a regression equation, there is a need to investigate an allowable error range within which the results of prediction can be allowed, on the basis of, for example, the standard error or standard deviation of the results of prediction. In this embodiment, a standard error Q (STEYX) between a predicted CD shift amount and a measured CD shift amount is obtained, and the allowable error range of the results of prediction is specified. The standard error is calculated using, for example, the following equation (3-1).

$$Q = \sqrt{\frac{\sum_{i=1}^{n}(X_i - X_i')^2}{n}} \quad (3\text{-}1)$$

In equation (3-1), $X_i$ denotes a measured value for a CD shift amount, $x'_i$ denotes a predicted value for a CD shift amount, and n denotes the number of CD shift amount values (that is, the number of wafers for prediction).

Figure 13:
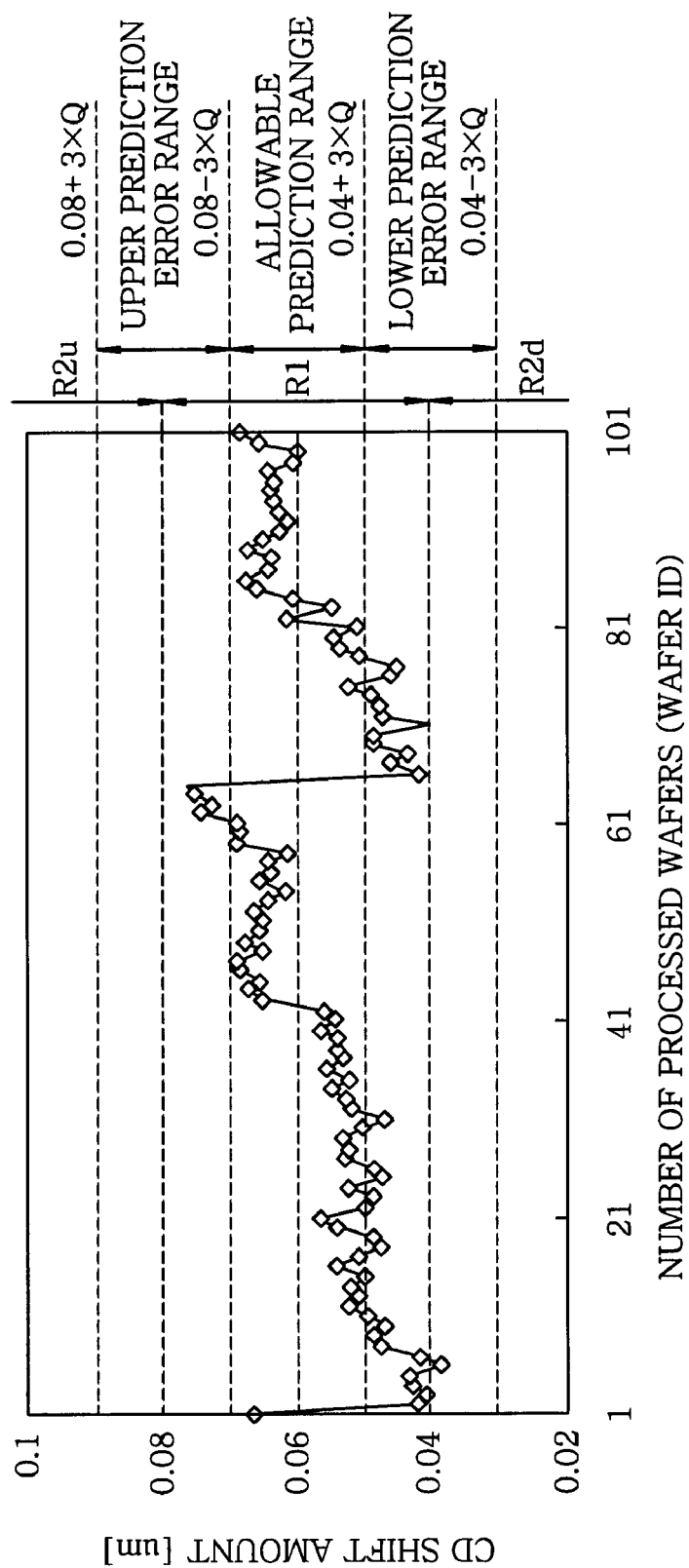
FIG. 13 is a diagram showing an example of the management of a CD shift amount using the predicted value of FIG. 11A.

As shown in FIG. 13, a management value range R1 required to manage the CD shift amount values of wafers for prediction so as to fall within an allowable range (an allowable error range or a first predicted value range) is set in advance. The management value range R1 is set to have a certain width based on a target CD shift amount value (0.06 μm), as shown in FIG. 13. In this case, the management value range R1 is in a range between 0.04 μm and 0.08 μm.

In this case, when the CD shift amount to be managed is, for example, a measured value, processing is performed in such a way that, if the measured value is within the management value range R1, it is determined that the measured value is within an allowable error range, whereas, if the measured value departs from the management value range R1, it is determined that the measured value is within a range R2u or R2d, exceeding management values, and, for example, error processing, can be performed.

In relation to this, when a CD shift amount is a predicted value, the prediction error thereof must be considered. Accordingly, prediction error ranges R3u and R3d are set such that the limit values (0.08 μm and 0.04 μm) of the management value range R1 exist within the prediction error ranges R3u and R3d, respectively. These prediction error ranges are set on the basis of the standard error Q. For example, as shown in FIG. 13, when the upper limit of the management value range R1 is 0.08 μm, the range of 0.08 μm±3×Q is set to the upper prediction error range R3u. When the lower limit of the management value range R1 is 0.04 μm, the range of 0.04 μm±3×Q is set to the lower prediction error range R3d. Further, in this embodiment, a value of 3×Q is about 0.01 μm.

When a range from the lower limit of the prediction error range R3u to the upper limit of the prediction error range R3d is an allowable prediction range R3, it can be determined that, if the predicted value for the CD shift amount is within the allowable prediction range R3, the corresponding CD shift amount value is within the measurement value range even if a prediction error is considered. In relation to this, when the predicted value for the CD shift amount departs from the allowable prediction range R3, it is determined that the corresponding CD shift amount departs from the management value range.

However, if the predicted value for the CD shift amount is within the prediction error range R3d or R3u even though the predicted value for the CD shift amount departs from the allowable prediction range R3, it is difficult to determine whether a corresponding wafer is good or defective using only the predicted value in consideration of a prediction error, and it is preferable to measure the CD shift amount of the wafer again. In relation to this, when the predicted value departs from the allowable prediction range R3 and also departs from the prediction error ranges R3d and R3u, it can be determined that the predicted value departs from the management value range R1 even if prediction error is considered, so that error processing, for example, can be performed without measuring the CD shift amount.

As described above, according to this embodiment, even if an error is included in the results of measurement on CD shift amount collected to create a model, a correlation (model) is created after moving average processing has been performed on the CD shift amount, thus minimizing the differences in prediction results caused by measurement error. As a result, the prediction accuracy can be improved.

Further, in this embodiment, since a CD shift amount is used for processing result data, the monitoring of CD shift amount requiring temporal and manual effort in measurement can be simply performed. Further, even for all of the wafers, CD shift amount values can be sufficiently predicted with high precision, so that CD shift amount values can be more suitably managed.

Further, in this embodiment, for example, data about etching rates obtained through etching processing or apparatus status data may be used as processing result data, instead of CD shift amount data. Besides, apparatus status data may be used as processing result data. For example, the thickness of the upper electrode 104, the film thickness of a by-product, the degree of consumption of parts, such as the focus ring 110a, etc. may be used. In this way, the degree of consumption of parts is used as apparatus status data, so that the time at which the plasma processing apparatus 100 is to be cleaned, the time at which the upper electrode 104 is to be replaced, etc. can be predicted.

Further, in this embodiment, electronic data is used as operation data. For example, the current (I), phase (P), voltage (V), and impedance (Z) of the fundamental wave and integer multiples thereof, which are applied to the lower electrode 102, as well as the trace data, can be used as the electronic data. Moreover, VI probe data or optical data can be used as the electronic data. The optical data includes, for example, the intensity of emission spectrum of wavelengths detected by the above-described optical measuring instrument 120. The intensity of the emission spectrum is inputted into the prediction apparatus 200 and is used for analysis processing.

Further, the case where etching processing is performed on a wafer W has been described, but the present invention can also be applied to a substrate processing apparatus for sputtering processing other than etching processing. Further, the substrate of the present invention is not limited to a wafer, which is a target processing substrate.

As described above, although embodiments have been described with reference to the attached drawings, the present invention is not limited to the above embodiments. Those skilled in the art will appreciate that various changes and modifications may be made without departing from the spirit and scope of the invention as defined in the following claims, and that they are included in the technical scope of the present invention.

For example, the plasma processing apparatus is not limited to a parallel plate plasma processing apparatus, and may be a helicon wave plasma processing apparatus, or an inductively coupled plasma processing apparatus.

The present invention can be applied to the prediction of the status of a target processing substrate processed by a plasma processing apparatus.

While the invention has been shown and described with respect to the embodiments, it will be understood by those skilled in the art that various changes and modifications may be made without departing from the scope of the invention as defined in the following claims.

What is claimed is:

1. A prediction method for a substrate processing apparatus, the prediction method predicting processing results from operation data on the substrate processing apparatus during a procedure for processing a target processing substrate in a processing chamber of the substrate processing apparatus, the prediction method comprising:

a data collection step of collecting operation data obtained whenever the target processing substrate is processed, and processing result data obtained by measuring status of the target processing substrate;

a moving average processing step of obtaining a moving average of a preset number of sets of data using the processing result data collected at the data collection step, thus obtaining moving average processing result data;

an analysis step of performing multivariate analysis using the operation data collected at the data collection step and the moving average processing result data obtained at the moving average processing step, thus obtaining a correlation between the operation data and the moving average processing result data; and a prediction step of predicting processing results using operation data obtained when a target processing substrate, other than the target processing substrate used to obtain the correlation at the analysis step, is processed on a basis of the correlation, wherein the moving average processing step is performed such that when processing result data, existing before and after maintenance of the substrate processing apparatus, is included in the processing result data, the processing result data is divided into groups for respective sections defined by the maintenance; and for each group, moving averages of a preset number of pieces of data are obtained using only processing result data belonging to the group, thus obtaining moving average processing result data.

2. The prediction method of claim 1, wherein the moving average processing step is performed such that, for each group, moving average processing result data corresponding to considered processing result data is calculated while the considered processing result data is shifted by one piece.

3. The prediction method of claim 2, wherein the moving average processing step is performed such that:

until a number of pieces of data preceding the considered processing result data reaches the preset number of pieces of data, an average value is obtained using all pieces of processing result data preceding the considered processing result data, and the average value is taken as moving average processing result data corresponding to the considered processing result data; and when the number of pieces of data preceding the considered processing result data reaches the preset number of pieces of data or more, an average value is obtained using only processing result data that immediately precedes the considered processing result data and corresponds to the preset number of pieces of data, and the obtained average value is taken as moving average processing result data corresponding to the considered processing result data.

4. The prediction method of claim 3, wherein the moving average processing step is performed so that the number of pieces of data required to obtain each moving average is preset for each group.

5. The prediction method of claim 4, wherein the number of pieces of data required to obtain each moving average is preset according to the number of pieces of processing result data belonging to each group.

6. The prediction method of claim 4, wherein the number of pieces of data required to obtain each moving average is one falling within a range between 2 and 10.

7. The prediction method of claim 1, wherein the prediction method is operated such that:

a management value range is set to have a certain width based on a target value of processing results so as to manage the processing results, an upper prediction error range is set to have a certain width based on an upper limit of the management value range, and a lower prediction error range is set to have a certain width based on a lower limit of the management value range;

if a predicted value for status of the target processing substrate obtained at the prediction step is within an allowable prediction range when a range from a lower limit of the upper prediction error range to an upper limit of the lower prediction error range is set to the allowable prediction range, status of the target processing substrate is determined to be normal;

if the predicted value is included in the upper prediction error range or the lower prediction error range even though the predicted value departs from the allowable prediction range, the status of the target processing substrate is determined based on a measured value obtained by measuring the target processing substrate; and if the predicted value departs from the allowable prediction range, and also departs from the upper prediction error range and the lower prediction error range, the status of the target processing substrate is determined to be abnormal.

8. The prediction method of claim 7, wherein each prediction error range is set according to a standard error between the predicted value and the measured value.

9. The prediction method of claim 7, wherein the predicted value is a processing dimension of the target processing substrate.

10. The prediction method of claim 1, wherein the processing result data is a processing dimension of the target processing substrate.

11. The prediction method of claim 1, wherein the operation data is electronic data obtained from a plurality of detectors provided in the substrate processing apparatus.

12. The prediction method of claim 1, wherein the analysis step uses Partial Least Squares (PLS) as the multivariate analysis.

13. A prediction apparatus for a substrate processing apparatus, the prediction apparatus predicting processing results from operation data on the substrate processing apparatus during a procedure for processing a target processing substrate in a processing chamber of the substrate processing apparatus, the prediction apparatus comprising:

data collection unit for collecting operation data obtained whenever the target processing substrate is processed, and processing result data obtained by measuring status of the target processing substrate;

moving average processing unit for obtaining a moving average of a preset number of pieces of data using the processing result data collected by the data collection unit, thus obtaining moving average processing result data;

analysis unit for performing multivariate analysis using the operation data collected by the data collection unit and the moving average processing result data obtained by the moving average processing unit, thus obtaining a correlation between the operation data and the moving average processing result data; and prediction unit for predicting processing results using operation data obtained when a target processing substrate, other than the target processing substrate used to obtain the correlation by the analysis unit, is processed on a basis of the correlation, wherein the moving average processing unit is operated such that when processing result data, existing before and after maintenance of the substrate processing apparatus, is included in the processing result data, the processing result data is divided into groups for respective sections defined by the maintenance; and for each group, moving averages of a preset number of pieces of data are obtained using only processing result data belonging to the group, thus obtaining moving average processing result data; and wherein the moving average processing unit calculates moving average processing result data corresponding to considered processing result data for each group while shifting the considered processing result data by one piece.

14. The prediction apparatus of claim 13, wherein the moving average processing unit is operated such that:

until a number of pieces of data preceding the considered processing result data reaches the preset number of pieces of data, an average value is obtained using all pieces of processing result data preceding the considered processing result data, and the average value is taken as moving average processing result data corresponding to the considered processing result data; and when the number of pieces of data preceding the considered processing result data reaches the preset number of pieces of data or more, an average value is obtained using only processing result data that immediately precedes the considered processing result data and corresponds to the preset number of pieces of data, and the obtained average value is taken as moving average processing result data corresponding to the considered processing result data.

15. The prediction apparatus of claim 14, wherein the number of pieces of data required to obtain each moving average is set in advance for each group.

16. The prediction apparatus of claim 15, wherein the number of pieces of data required to obtain each moving average is set in advance according to the number of pieces of processing result data belonging to each group.

17. The prediction apparatus of claim 15, wherein the number of pieces of data required to obtain each moving average is one falling within a range between 2 and 10.

18. A prediction apparatus for a substrate processing apparatus, the prediction apparatus predicting processing results from operation data on the substrate processing apparatus during a procedure for processing a target processing substrate in a processing chamber of the substrate processing apparatus, the prediction apparatus comprising:

data collection unit for collecting operation data obtained whenever the target processing substrate is processed, and processing result data obtained by measuring status of the target processing substrate;

moving average processing unit for obtaining a moving average of a preset number of pieces of data using the processing result data collected by the data collection unit, thus obtaining moving average processing result data;

analysis unit for performing multivariate analysis using the operation data collected by the data collection unit and the moving average processing result data obtained by the moving average processing unit, thus obtaining a correlation between the operation data and the moving average processing result data; and prediction unit for predicting processing results using operation data obtained when a target processing substrate, other than the target processing substrate used to obtain the correlation by the analysis unit, is processed on a basis of the correlation, wherein the prediction apparatus is operated such that:

a management value range is set to have a certain width based on a target value of processing results so as to manage the processing results, an upper prediction error range is set to have a certain width based on an upper limit of the management value range, and a lower prediction error range is set to have a certain width based on a lower limit of the management value range;

if a predicted value for status of the target processing substrate obtained at the prediction step is within an allowable prediction range when a range from a lower limit of the upper prediction error range to an upper limit of the lower prediction error range is set to the allowable prediction range, status of the target processing substrate is determined to be normal;

if the predicted value is included in the upper prediction error range or the lower prediction error range even though the predicted value departs from the allowable prediction range, the status of the target processing substrate is determined based on a measured value obtained by measuring the target processing substrate; and if the predicted value departs from the allowable prediction range, and also departs from the upper prediction error range and the lower prediction error range, the status of the target processing substrate is determined to be abnormal.

19. The prediction apparatus of claim 18, wherein each prediction error range is set according to a standard error between the predicted value and the measured value.

20. The prediction apparatus of claim 18, wherein the predicted value is a processing dimension of the target processing substrate.

21. The prediction apparatus of claim 18, wherein the processing result data is a processing dimension of the target processing substrate.

22. The prediction apparatus of claim 18, wherein the operation data is electronic data obtained from a plurality of detectors provided in the substrate processing apparatus.

23. The prediction apparatus of claim 18, wherein the analysis unit uses Partial Least Squares (PLS) as the multivariate analysis.

* * * * *